US012562587B2

(12) United States Patent
Wang et al.

(10) Patent No.: US 12,562,587 B2
(45) Date of Patent: Feb. 24, 2026

(54) SMART METER SOCKET ADAPTER FOR CONNECTING BATTER ENERGY STORAGE SYSTEM

(71) Applicant: FranklinWH Energy Storage Inc., San Jose, CA (US)

(72) Inventors: Daqing Wang, Shenzhen (CN); Gang Xiao, Shenzhen (CN); Ke Bi, San Jose, CA (US); Cheung (Gary) Lam, San Jose, CA (US); Douglas Amarhanow, San Jose, CA (US); Qing Zhang, Shenzhen (CN); Tao Wang, Shenzhen (CN); Lianyan Cai, Shenzhen (CN); Yanxiang Wang, Shenzhen (CN); Mingfeng Li, Shenzhen (CN); Dongcai Tang, Shenzhen (CN); Jingming Leng, Shenzhen (CN); Long Chen, Shenzhen (CN)

(73) Assignee: Franklin WH Energy Storage Inc., San Jose, CA (US)

( * ) Notice: Subject to any disclaimer, the term of this patent is extended or adjusted under 35 U.S.C. 154(b) by 0 days.

(21) Appl. No.: 18/952,717

(22) Filed: Nov. 19, 2024

(65) Prior Publication Data

US 2025/0343418 A1 Nov. 6, 2025

Related U.S. Application Data

(60) Provisional application No. 63/664,725, filed on Jun. 27, 2024, provisional application No. 63/664,781, (Continued)

(51) Int. Cl.
*H02J 3/32* (2006.01)
*G01R 11/04* (2006.01)
(Continued)

(52) U.S. Cl.
CPC ................ *H02J 3/32* (2013.01); *G01R 11/04* (2013.01); *G01R 22/065* (2013.01); *H02J 3/381* (2013.01);
(Continued)

(58) Field of Classification Search
CPC .. H02J 3/32; H02J 9/068; H02J 7/0047; H02J 7/35; H02J 9/062; H02J 2310/12
(Continued)

(56) References Cited

U.S. PATENT DOCUMENTS 7,683,603 B1 * 3/2010 Lathrop ................... H02J 9/06
361/666
10,916,940 B2 2/2021 Donahue et al.
(Continued)

*Primary Examiner* — Michael R. Fin
(74) *Attorney, Agent, or Firm* — ANOVA LAW GROUP, PLLC

(57) ABSTRACT
A meter socket adapter (MSA) for connecting a battery energy storage system (BESS) to a household microgrid through a meter combo load center. The MSA includes: a housing matching an electricity meter and a meter socket in the meter combo load center; a plurality of power conductors that connect among the electricity meter, the meter socket, and BESS; a meter interconnection device (MID) switch for connecting a utility grid or one or more distribution energy resource (DER) devices to supply power to household loads in the household microgrid; a MID driving circuit for driving the MID switch to close or open; and a MID connection detection circuit to verify an electrical connection of a closed MID switch.

15 Claims, 28 Drawing Sheets

Related U.S. Application Data filed on Jun. 27, 2024, provisional application No. 63/641,139, filed on May 1, 2024.

(51) Int. Cl.
*G01R 22/06* (2006.01)
*H02J 3/38* (2006.01)
*H02J 7/00* (2006.01)
*H02J 7/35* (2006.01)
*H02J 9/06* (2006.01)

(52) U.S. Cl.
CPC .............. *H02J 7/0047* (2013.01); *H02J 7/35* (2013.01); *H02J 9/062* (2013.01); *H02J 9/068* (2020.01); *H02J 2310/12* (2020.01)

(58) Field of Classification Search
USPC ........................................................ 307/66
See application file for complete search history.

(56) References Cited

U.S. PATENT DOCUMENTS

| | | | |
|---|---|---|---|
| 10,951,036 B2 | 3/2021 | Donahue et al. | |
| 11,187,734 B2 | 11/2021 | Karlgaard et al. | |
| 2011/0004357 A1* | 1/2011 | Mathiowetz ............ | H02J 3/381 |
| | | | 700/295 |
| 2015/0036267 A1* | 2/2015 | Miller ...................... | H02B 1/24 |
| | | | 361/625 |
| 2022/0045598 A1* | 2/2022 | Huang ................... | H02M 1/32 |
| 2023/0069377 A1 | 3/2023 | Hammill et al. | |
| 2023/0246479 A1* | 8/2023 | Evans ................... | H01H 71/02 |
| | | | 307/65 |
| 2023/0288451 A1 | 9/2023 | Hassel et al. | |

* cited by examiner

SMART METER SOCKET ADAPTER FOR CONNECTING BATTER ENERGY STORAGE SYSTEM

CROSS-REFERENCE TO RELATED APPLICATION

This application claims priority to U.S. Provisional Patent Application No. 63/641,139, filed on May 1, 2024, U.S. Provisional Patent Application No. 63/664,725, filed on Jun. 27, 2024, and U.S. Provisional Patent Application No. 63/664,781, filed on Jun. 27, 2024, and the entire contents of all of which are incorporated herein by reference.

TECHNICAL FIELD

The present disclosure relates to the technical field of utility grid connection technology, and more particularly, to a smart meter socket adapter (MSA) for connecting a battery energy storage system (BESS).

BACKGROUND

Residential homes often receive electricity services by connecting to a utility grid through a utility electricity meter. The electricity is then distributed to various household loads such as appliances, electronics, computers, and lightings through a main panel (also known as a main distribution panel or a distribution panel). The main panel often includes circuit breakers to protect against overloading or short circuits.

Recently, more and more households adopt various electricity generation systems such as a solar electricity generation system, a diesel electricity generation system, etc. The solar electricity generation systems allow households to switch part of their energy consumption to renewable energy source, and the diesel electricity generation system provides backup electricity for households in case of utility grid failures due to inclement weather. A typical solar electricity generation system may include solar panels, an inverter, and a battery energy storage system (BESS). The solar panels convert solar energy into direct current (DC) electricity. The DC electricity is converted by the inverter to the alternate current (AC) electricity. The AC electricity may be used to charge the batteries in BESS, power the household loads, and/or supply back to the utility grid. To achieve the above objectives, the inverter, BESS, the main panel in a household together form a microgrid. The microgrid and the utility grid may be interconnected through a microgrid interconnection device (MID) controlled by an energy management system (EMS).

Utility service providers often supply a meter combo load center to residential customers. The meter combo load center integrates an electricity meter with a main panel. For security reasons, the meter combo load center does not provide access for the connection of the MID. Retrofitting the existing meter combo load center for the connection of the MID is often costly, and causes extended disruption to the electricity service. The present disclosure provides a method of interconnecting between the microgrid and the utility grid cost-effectively and rapidly.

SUMMARY

One aspect of the present disclosure provides a meter socket adapter (MSA) for connecting a battery energy storage system (BESS) to a household microgrid through a meter combo load center. The MSA includes: a housing matching an electricity meter and a meter socket in the meter combo load center; a plurality of power conductors that connect among the electricity meter, the meter socket, and BESS; a meter interconnection device (MID) switch for connecting a utility grid or one or more distribution energy resource (DER) devices to supply power to household loads in the household microgrid; a MID driving circuit for driving the MID switch to close or open; and a meter detection circuit for detecting insertion and removal of the electricity meter.

Another aspect of the present disclosure provides an energy management system (EMS) device for managing a meter socket adapter (MSA) connected household microgrid. The EMS device includes: an EMS controller configured to control a meter interconnection device (MID) switch disposed inside MSA to respond to occurrence and restoration of an outage of a utility grid, and control one or more distribution energy resource (DER) devices to supply power to household loads in the MSA connected household microgrid to optimize household energy consumption and generation; and an MID controller configured to monitor a state of the utility grid and a state of the household microgrid, and based on the state of the utility grid and the state of the household microgrid, control a MID switch to make suitable electrical connections among the utility grid, the one or more DER devices, and the household loads in the household microgrid.

Another aspect of the present disclosure provides a household microgrid being connected to a utility grid. The household microgrid includes: a meter combo load center for connection between the household microgrid and the utility grid, the meter combo load center at least including an electricity meter and a meter socket; a meter socket adapter (MSA) disposed between the electricity meter and the meter socket for connecting an energy management system (EMS) device and one or more distribution energy resource (DER) devices to the household microgrid; the one or more DER devices for household energy generation; household loads for household energy consumption; and the EMS device for managing and optimizing household energy consumption and generation.

DETAILED DESCRIPTION OF THE EMBODIMENTS

To make the objectives, technical solutions, and advantages of the present disclosure clearer, the technical solutions in the embodiments of the present disclosure will be clearly and completely described below in conjunction with the accompanying drawings in the embodiments of the present disclosure. Obviously, the embodiments described herein are merely some of the embodiments of the present disclosure, but not all of them. Based on the embodiments in the present disclosure, all other embodiments obtained by those of ordinary skill in the art without creative efforts should fall within the scope of protection of the present disclosure. Under the circumstances of no conflict, the embodiments and features in the present disclosure may be combined with each other arbitrarily. The processes illustrated in the flowcharts of the drawings may be a set of computer-executable instructions performed in a computer system. Although a logical order is shown in the flowcharts, in some cases the processes shown or described may be performed in an order different from described herein.

Figure 1:
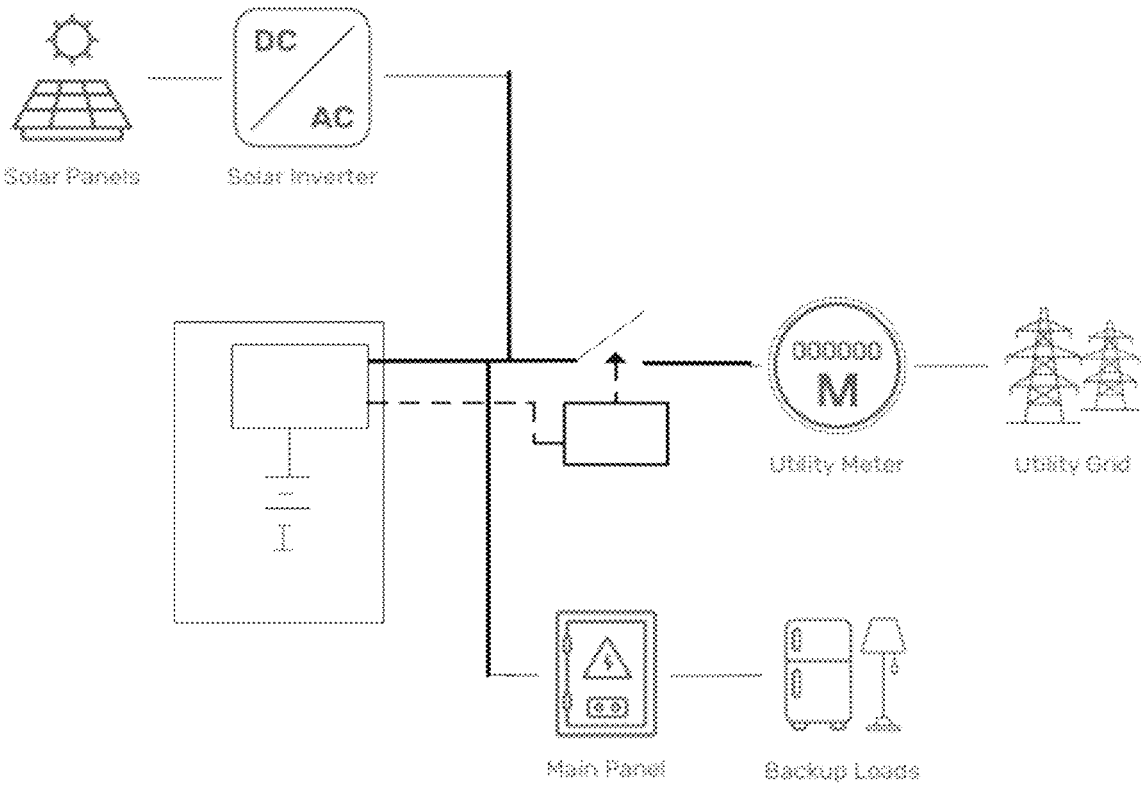
FIG. 1 illustrates a schematic diagram of interconnection between household microgrid and utility grid according to some embodiments of the present disclosure.

FIG. 1 illustrates a schematic diagram of interconnection between household microgrid and utility grid according to some embodiments of the present disclosure.

Generally, the household microgrid is connected to the utility grid through a residential power distribution panel. For example, the residential power distribution panel may be a meter combo load center. The meter combo load center is a convenient and space-saving option for interconnection between a household microgrid and a utility grid. The meter combo load center is often installed in new construction and as part of electrical service upgrade. The meter combo load center is commonly used in US market and is popular specifically in California state. According to the statics provided by interviewed installers in California state, meter combo load centers are installed in approximately 90% of home sites. Among them, 25% of home sites are installed with a specific type of meter combo load centers, i.e., SQUARE-D meter combo load center.

As shown in FIG. 1, the utility grid is connected to the household microgrid through a utility meter. The meter combo load center includes a main panel and the utility meter shown in FIG. 1. The household microgrid provides connections between the main panel and at least one of a power backup system or household loads. The power backup system may include a solar power generation system and a battery energy storage system (BESS). The solar power generation system generates electricity from sun light to meet the household electricity needs and potentially supply back to the electricity grid. The solar power generation system and the battery energy storage system may be connected to the electricity meter through a microgrid interconnection device (MID). The household microgrid also includes an energy management system (EMS) to manage the electricity generation, consumption, and feeding toward the utility grid.

BESS refers to a system that stores energy in the form of electricity in batteries for later use. BESS can be used to store excess energy generated from renewable sources like solar or wind power, and then discharge that stored energy when needed, such as during peak demand periods or when renewable energy generation is low. BESS can be used to provide backup power for critical loads in homes during power outages.

MID is a piece of equipment that facilitates the connection of a microgrid to the larger electrical grid or to other microgrids. It manages the flow of electricity between the microgrid and the utility grid, ensuring that power is exchanged efficiently and safely. This device plays a crucial role in enabling the integration of distributed energy resources, such as solar panels and wind turbines, into the broader grid infrastructure. It often includes protective and control functions to ensure stable and reliable operation of the interconnected systems.

In general, the meter combo load center often includes an electricity meter that is inserted into a meter socket, a main circuit breaker, and a plurality of branch circuit breakers. The main circuit breaker provides over-current protection for the input current supplied from the utility grid through the electricity meter. The plurality of branch circuit breakers provide over-current protection for currents supplied to the household, and over-current protection for currents supplied to the utility grid from the solar power generation system and/or the battery energy storage system.

The meter combo load center is often sealed to prevent unauthorized access to electrical connections between the utility gird, the electricity meter, and the circuit breakers. Thus, it is difficult to make connections between the solar power generation system and the battery energy storage system, and the electricity meter.

Often, the meter socket adapter is disposed between the meter socket and the electricity meter to provide connection to MID, which in turn, provides connection to the solar generation system and the battery energy storage system.

The use of a meter socket adaptor, also referred to as a "meter collar", shall be permitted as an additional interconnection option for the customer generation system or an electric vehicle to the customer premises. The meter collar is an "extension" device placed between the meter socket and the utility meter.

When retrofitting the existing meter combo load center for connecting the solar power generation system and BESS, it is difficult to install MID at the on-site meter combo load center. Because the meter combo load center is sealed, it is difficult to rearrange the electrical connections. Further, there is often no room to add new connections to the existing meter combo load center.

Figure 2:
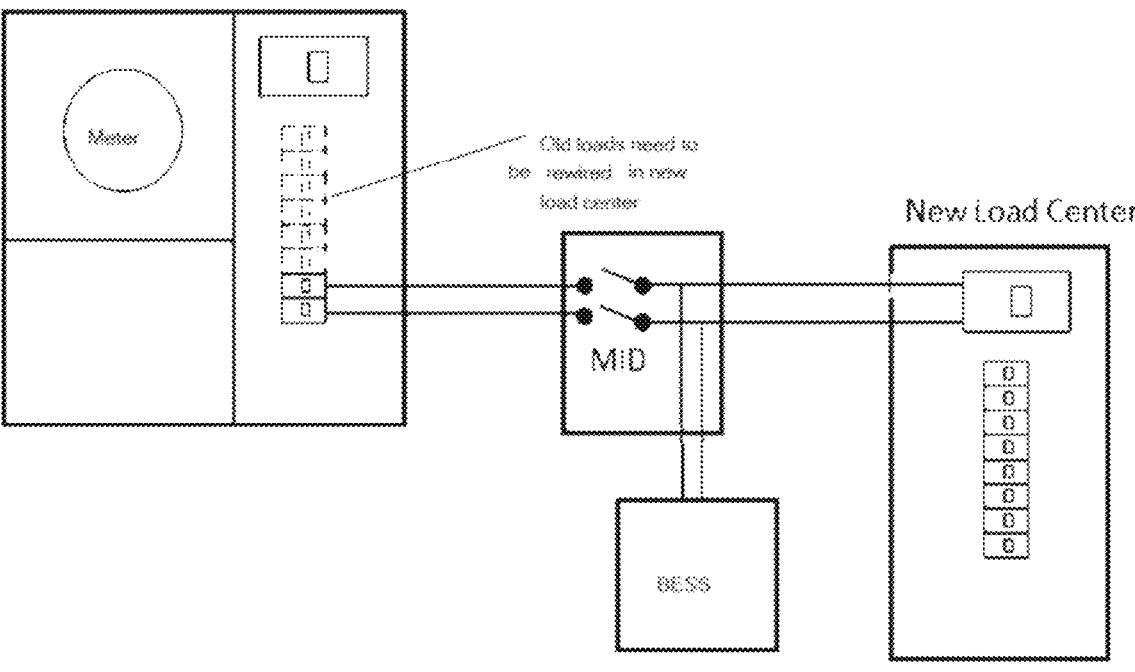
FIG. 2 illustrates a schematic diagram of retrofitting an existing meter combo load center.

FIG. 2 illustrates a schematic diagram of retrofitting an existing meter combo load center. As shown in FIG. 2, as a new load, MID is connected to the meter combo load center. Through MID, a new meter combo load center is added, and existing loads need to be rewired in the new meter combo load center, which is costly and labor intensive. In addition, BESS is connected to MID. A solar power generation system (not shown) may be connected to BESS.

When a utility customer installs BESS for backup of household loads with the meter combo load center, the following issues may occur. It is difficult to find a disconnect location where MID needs to be inserted. Because the meter socket is tightly coupled with circuit breakers and wiring conducts (or busbars) in the main panel, there is little space for wiring and inserting MID between the household microgrid and BESS.

Removal of electricity meter or wiring conducts connected to the electricity meter can only done by utility workers. In order to install MID, the load circuits inside the main panel need to be removed and a new main panel needs to be installed. In some extreme cases, up to 48 load circuits may need to be removed, and this may require breaking through walls. The scope of work may cause up to 4 hours or more outage on site during the installation. The new meter combo load center may contain more than 20 circuits in the main panel, which is equivalent to the scope of work for upgrading the main panel and will incur substantial installation costs.

An existing meter combo load center may include a main panel full of circuit breakers. The electrical wiring behind the circuit breakers is messy. Only authorized workers from utility service provides may perform the rearrangement of the electrical wiring. Adding new high current connections required for connecting the solar power generation system and BESS is unlikely or at least labor intensive and costly.

When the electricity meter is removed and the meter socket is exposed.

Another issue for retrofitting the existing meter combo load center is difficulty of metering of the AC currents of the solar power generation system and BESS. When installing BESS, it is necessary to meter a grid port thereof. However, for the narrow space or copper busbars and thick, rigid conductors in the meter combo load center, it may be impossible to install coil transformers (CTs) for grid metering.

Rogowski coils are often installed for electricity metering. When the solar power generation system and BESS are connected to the main panel, the AC currents thereof need to be measured for EMS to make various energy management decisions. In the case of retrofitting the existing meter combo load center, Rogowski coils may be installed on the electrical wiring for connecting the solar power generation system and BESS to measure the AC currents.

Compared to CTs, Rogowski coils are more expensive and less accurate for metering. This will make retrofitting the existing meter combo load center more complex and less reliable. The utility customer will have to pay additional costs of, for example, $400~$800 for Rogowski coils. In some scenarios, there may not be enough space in the existing meter combo load center to accommodate Rogowski coils, and a new meter combo load center may have to be installed and the electrical connections may have to be completely rewired.

The present disclosure provides a system of interconnecting between a household microgrid and a utility grid using a meter socket adapter (MSA) and a meter interconnection device (MID) for connecting the solar power generation system and BESS quickly and cost-effectively. The system may also be used to connect other residential power generation and energy storage systems to the meter combo load center.

Figure 3:
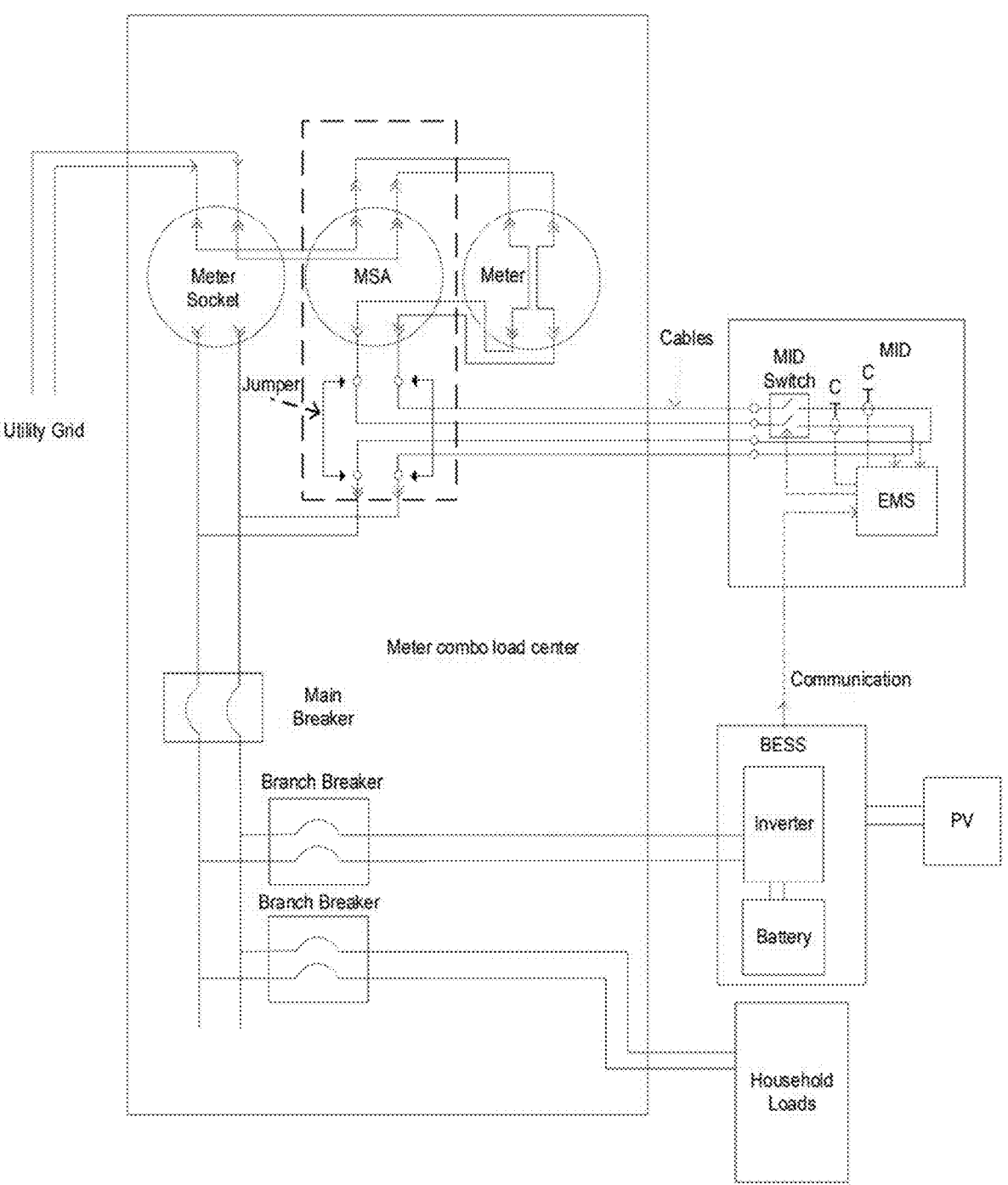
FIG. 3 illustrates a schematic diagram of a system of interconnecting a household microgrid and a utility grid using a meter socket adapter (MSA) and a microgrid interconnection device (MID) according to some embodiments of the present disclosure.

FIG. 3 illustrates a schematic diagram of a system of interconnecting a household microgrid and a utility grid using a meter socket adapter (MSA) and a microgrid interconnection device (MID) according to some embodiments of the present disclosure.

As shown in FIG. 3, the system includes a meter combo load center that is connected to a utility grid on the left and is connected to household loads on the right. The system also includes a meter socket adapter (MSA) installed between a meter socket and an electricity meter to connect to a microgrid interconnection device (MID).

When the electricity meter is inserted into the meter socket without MSA, the electricity flows from the utility grid into the meter socket, passes through the electricity meter, and enters the main circuit breaker. MSA is configured to insert into the meter socket of the meter combo load center, and then the electricity meter is inserted from above MSA. MSA connects electrical connection leads at the rear end of the electricity meter to input ends of MID. Output ends of MID are then connected back to MSA. MSA reconnects the load side of the meter combo load center. When MSA is inserted between the electricity meter and the meter socket, the electricity flows from the utility grid into the meter socket, passes through MSA and the electricity meter, re-enters MSA, passes through MID, re-enters MSA, and enters the main circuit breaker. In this case, MSA reroutes the electricity through MID before entering the main circuit breaker.

In some embodiments, the mains input of the meter socket in the meter combo load center is connected to MSA. The electrical output from the back end of the electricity meter in MSA is connected to a MID input. The output of MID is then connected back to MSA. The back end of MSA is then connected to the main circuit breaker of the meter combo load center. As such, MSA includes: a body, conductors for inserting into the meter socket, conductors for accepting the electricity meter, connectors for connecting to MID, MID cable connectors (with cables), internal conductors, internal insulation material, and jumper sockets.

In some embodiments, MID includes an MID switch capable of connecting and disconnecting the electricity that passes through MID. MID further includes CTs that monitor a status of the electricity coming from the utility grid and also measure an electrical current passing through MID.

In some embodiments, MSA further includes sockets for jumpers. The jumpers may be plugged in to allow the electricity from the utility grid to feed through MSA and the electricity meter to the main circuit breaker when MID is not connected through electrical cables that extend from MSA, for example, when MID needs to be serviced or replaced.

In some embodiments, the system further includes an energy management system (EMS). EMS is included in MID as shown in FIG. 3. In some other embodiments, EMS may be located outside MID. EMS may obtain electrical current measurements collected by CTs, and may control the MID switch to disconnect the household microgrid from the utility grid or re-connect the household microgrid to the utility grid.

In the embodiments of the present disclosure, the system facilitates the connection of MID through MSA without unsealing the meter combo load center to indirectly access the electrical connections inside the enclosure of the meter combo load center. As a result, the system makes connections between the solar power generation system and the battery energy storage system, and the electricity meter through MID.

After detecting a power outage, EMS first controls MID to disconnect and isolates the household microgrid from the utility grid, such that a power output of BESS is prevented from feeding to the utility grid. After confirming that the utility grid is safely disconnected, EMS re-configures the electrical connections to use the power output of BESS as a backup power to supply to the household loads. After detecting that the mains power from the utility grid is restored, EMS controls MID to re-connect the household loads to the utility grid. In this way, the household loads can be directly powered by the mains power alone or jointly powered by the mains power and the power output of BESS.

As shown in FIG. 3, EMS communicatively connected to BESS, the MID switch, CTs. BESS may send a status thereof to EMS. The BESS status may include a charge status of a battery in BESS and whether a PV of solar panels is supplying to BESS. CTs may send the measurements of the electrical current to EMS periodically. Alternatively, CTs may send the measurements of the electrical current to EMS in response an inquiry from EMS. ENS controls the MID switch to connect and disconnect the electrical connections with MSA. In addition, EMS may also directly connect to the electrical connections inside MID to monitor the status of the utility grid.

In the embodiments of the present disclosure, CTs are added to MID to measure the electrical current from the utility grid without the need for installing CTs inside the meter combo load center. CTs may also be added to MSA or both MID and MSA, which are limited by the present disclosure. Regardless of where CTs are added, the measurements by CTs are sent to EMS for making power management decisions. The system not only addresses the problem of connecting MID between the household microgrid and the utility grid, but also solves the problem of lacking space to accommodate CTs inside the meter combo load center, thereby saving system installation time, and reducing field installation labor and material cost.

Various examples of the system are described in detail below with reference to the corresponding drawings.

Figure 4:
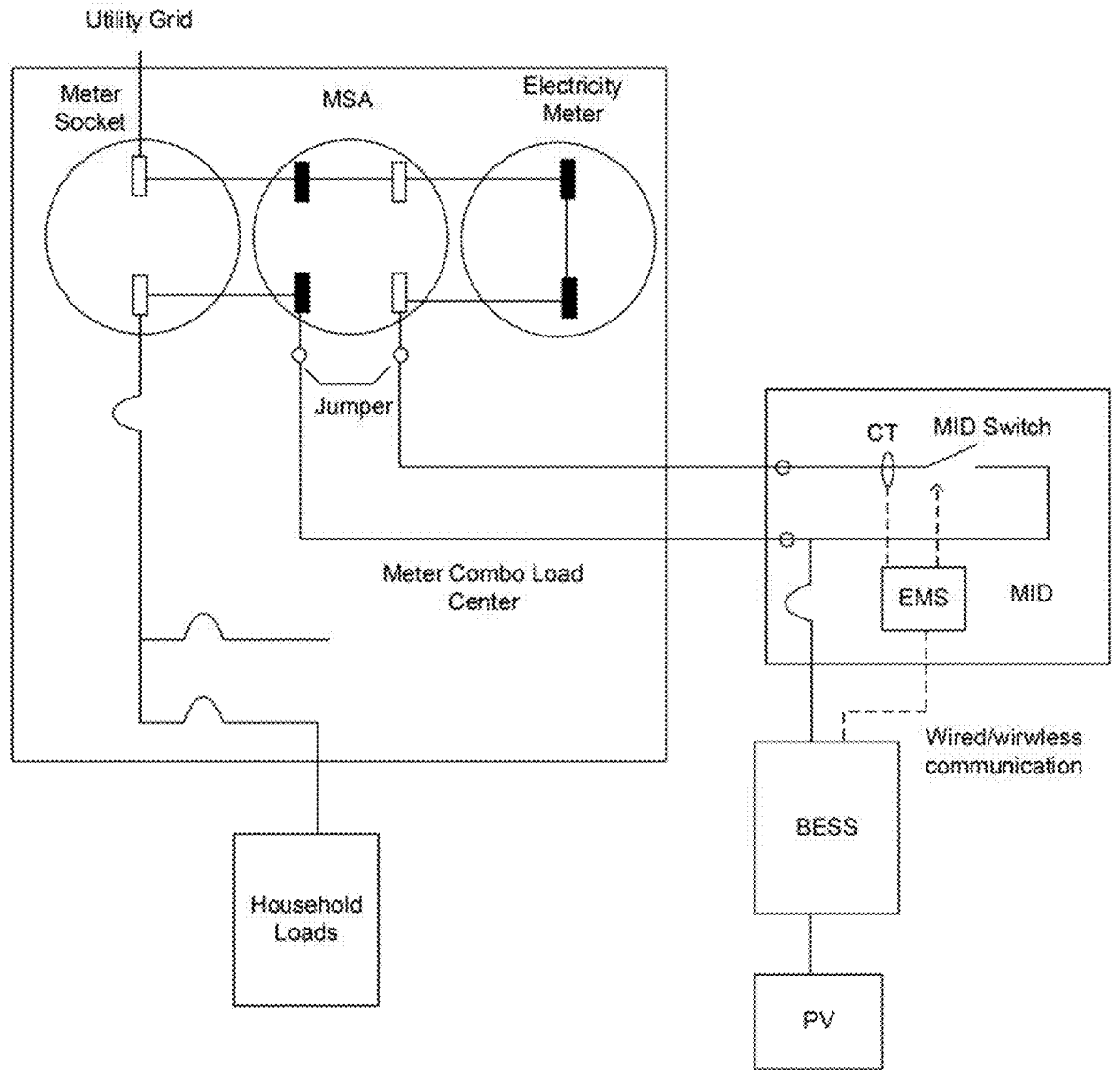
FIG. 4 illustrates a schematic diagram showing an exemplary household microgrid connection according to some embodiments of the present disclosure.

FIG. 4 illustrates a schematic diagram showing an exemplary household microgrid connection according to some embodiments of the present disclosure. In this example as shown in FIG. 4, the utility grid feeds into the meter combo load center. The meter combo load center includes the meter socket, MSA that plugs into the meter socket, the electricity meter that plugs into MSA, the main circuit breaker, and the branch circuit breakers. MID is connected to MSA through the electrical cables, and includes a built-in EMS.

In some embodiments, the electricity flows into the meter socket from the utility grid, passes through MSA, passes through the electricity meter, returns to MSA, and continues to MID. EMS obtains the status of the utility grid through CT disposed in MID. In response to the status of the utility grid being normal, EMS controls the MID switch to connect the electrical connection between the utility grid and the household microgrid. In response to the status of the utility grid being abnormal, EMS controls the MID switch to disconnect the electrical connection between the utility grid and the household microgrid. In the meantime, BESS is connected to the household microgrid through a circuit breaker inside MID. EMS communicates with BESS through a wired or a wireless connection to monitor and manage BESS along with the solar panel PV that is connected to BESS. In this case, the electricity generated by the solar panel PV feeds into BESS, passes through the circuit breaker in MID, goes into MSA and then the meter socket, continues to pass through the main circuit breaker and the branch circuit breaker, and finally supplies to the household loads.

Further, MID may be installed in a location different from the meter combo load center, and MID may be connected quickly to the meter combo load center by plugging in electrical cables to connectors on both MSA and MID. When MID is temporary put out of service, the electrical cables may be disconnected from the connectors on MSA and jumper cables may be plugged into the connectors on MSA, such that the electrical power supplied from the utility grid is uninterrupted.

Figure 5:
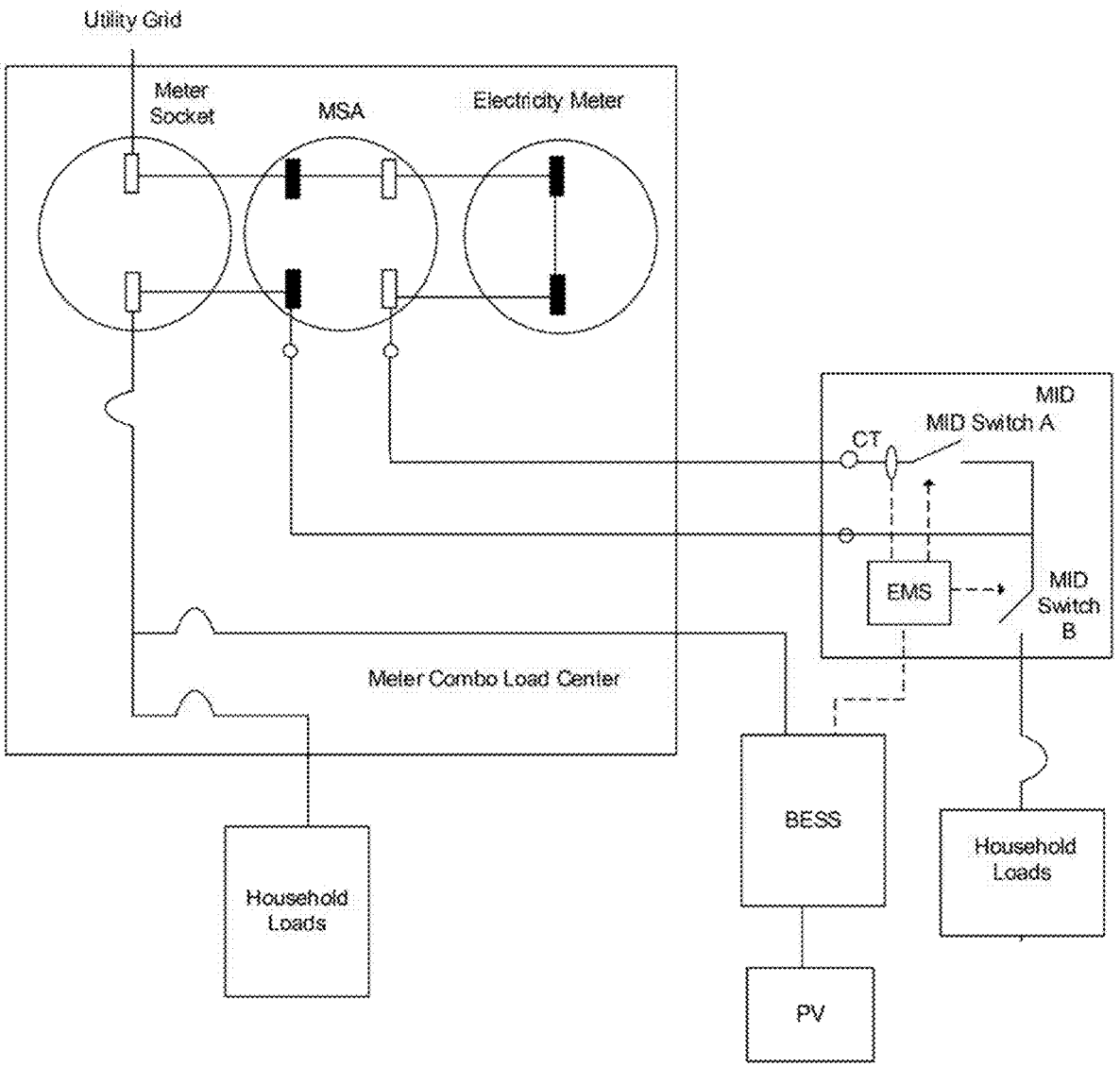
FIG. 5 illustrates a schematic diagram showing another exemplary household microgrid connection according to some embodiments of the present disclosure.

FIG. 5 illustrates a schematic diagram showing another exemplary household microgrid connection according to some embodiments of the present disclosure. In this example as shown in FIG. 5, the utility grid feeds into the meter combo load center. The meter combo load center includes the meter socket, MSA that plugs into the meter socket, the electricity meter that plugs into MSA, the main circuit breaker, and the branch circuit breakers. MID is connected to MSA through the electrical cables, and includes a built-in EMS.

In some embodiments, the electricity flows into the meter socket from the utility grid, passes through MSA, passes through the electricity meter, returns to MSA, and continues to MID. EMS obtains the status of the utility grid through CT disposed in MID. In response to the status of the utility grid being normal, EMS controls the MID switch A to connect the electrical connection between the utility grid and the household microgrid. In response to the status of the utility grid being abnormal, EMS controls the MID switch A to disconnect the electrical connection between the utility grid and the household microgrid. In the meantime, BESS is connected to the household microgrid through a circuit breaker inside MID. EMS communicates with BESS through a wired or a wireless connection to monitor and manage BESS along with the solar panel PV that is connected to BESS. In this case, the electricity generated by the solar panel PV feeds into BESS, passes through the branch circuit breaker in the meter combo load center, goes back into another branch circuit breaker and then the household loads. Alternatively, the electricity generated by the solar panel PV feeds into BESS, passes through the branch circuit breaker and the main circuit breaker in the meter combo load center, goes into the meter socket and then MSA, continues to pass through MSA to go into MID, and finally supplies to the household loads that are connected to MID through a circuit breaker.

Further, MID may be installed in a location different from the meter combo load center, and MID may be connected quickly to the meter combo load center by plugging in electrical cables to connectors on both MSA and MID. When MID is temporary put out of service, the electrical cables may be disconnected from the connectors on MSA and jumper cables may be plugged into the connectors on MSA, such that the electrical power supplied from the utility grid is uninterrupted.

Figure 6:
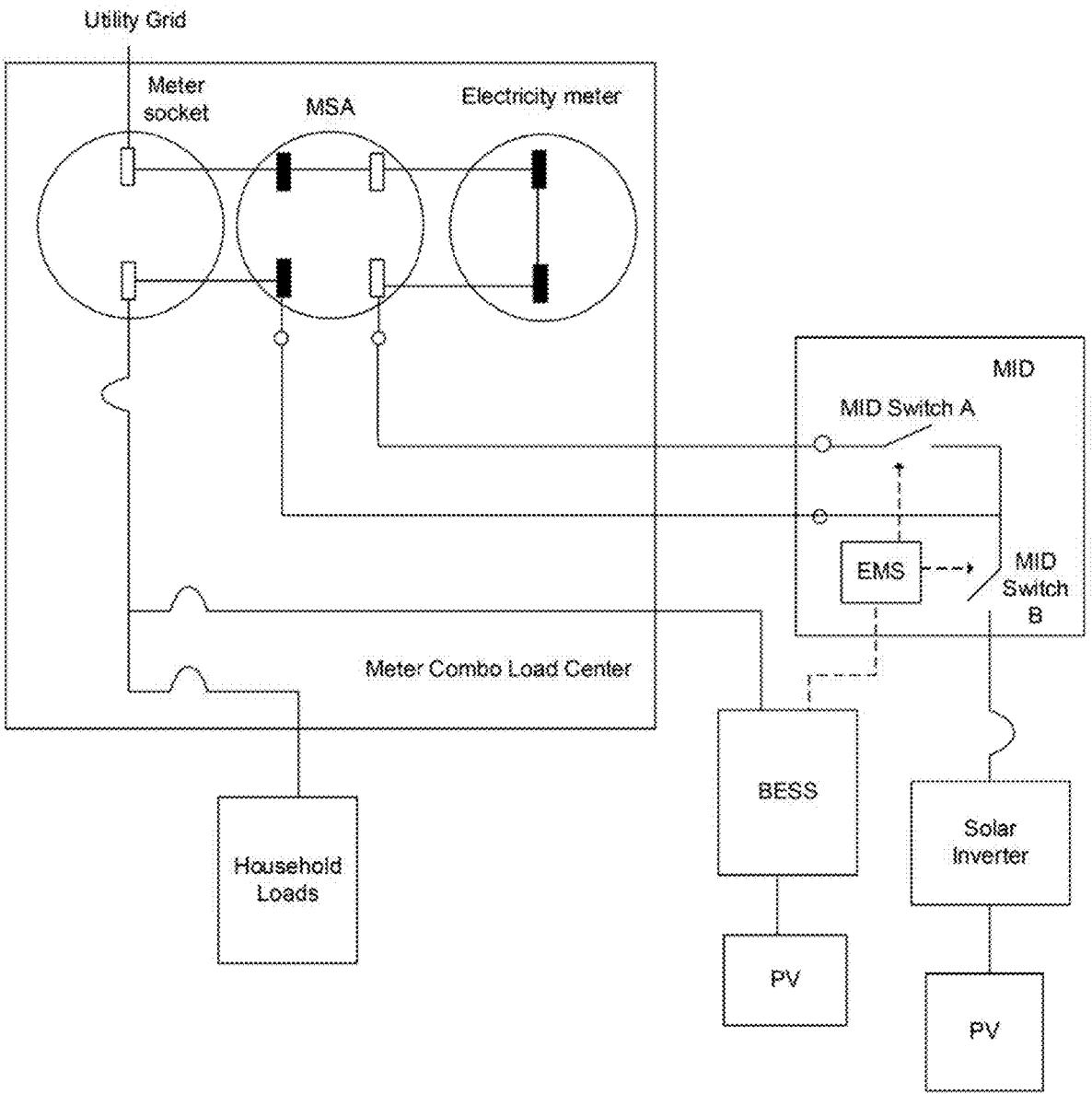
FIG. 6 illustrates a schematic diagram showing another exemplary household microgrid connection according to some embodiments of the present disclosure.

FIG. 6 illustrates a schematic diagram showing another exemplary household microgrid connection according to some embodiments of the present disclosure. In this example as shown in FIG. 6, the utility grid feeds into the meter combo load center. The meter combo load center includes the meter socket, MSA that plugs into the meter socket, the electricity meter that plugs into MSA, the main circuit breaker, and the branch circuit breakers. MID is connected to MSA through the electrical cables, and includes a built-in EMS.

In some embodiments, the electricity flows into the meter socket from the utility grid, passes through MSA, passes through the electricity meter, returns to MSA, and continues to MID. EMS obtains the status of the utility grid through CT disposed in MID. In response to the status of the utility grid being normal, EMS controls the MID switch A to connect the electrical connection between the utility grid and the household microgrid. In response to the status of the utility grid being abnormal, EMS controls the MID switch A to disconnect the electrical connection between the utility grid and the household microgrid. In the meantime, BESS is connected to the household microgrid through a circuit breaker inside MID. EMS communicates with BESS through a wired or a wireless connection to monitor and manage BESS along with the solar panel PV that is connected to BESS. In this case, the electricity generated by the solar panel PV feeds into BESS, passes through the branch circuit breaker in the meter combo load center, goes back into another branch circuit breaker and then the household loads. Alternatively, the electricity generated by the solar panel PV feeds into solar inverter, passes through the MID switch B in MID, goes into MSA and then the meter socket, continues to pass through the main circuit breaker and the branch circuit breaker, and finally supplies to the household loads.

Further, MID may be installed in a location different from the meter combo load center, and MID may be connected quickly to the meter combo load center by plugging in electrical cables to connectors on both MSA and MID. When MID is temporary put out of service, the electrical cables may be disconnected from the connectors on MSA and jumper cables may be plugged into the connectors on MSA, such that the electrical power supplied from the utility grid is uninterrupted.

Figure 7:
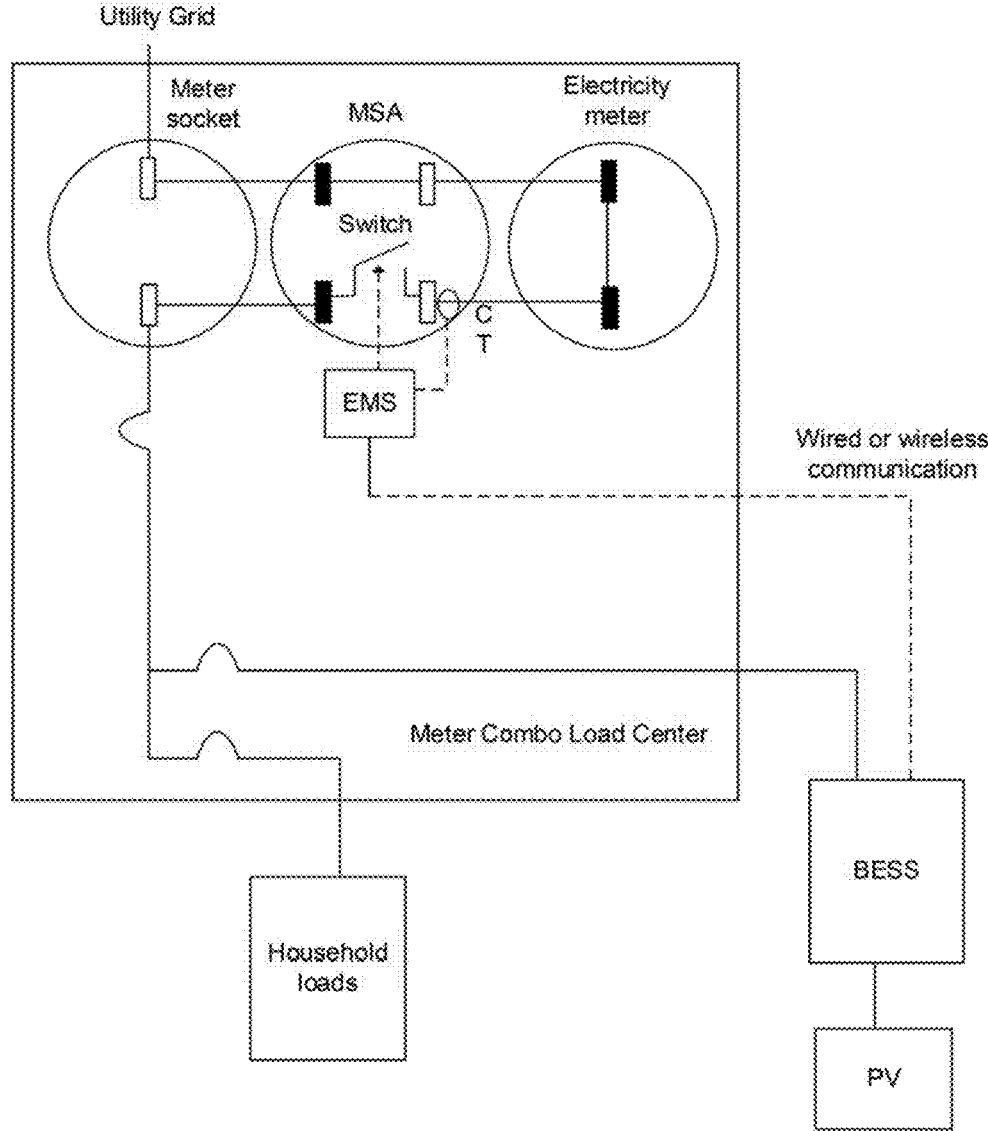
FIG. 7 illustrates a schematic diagram showing another exemplary household microgrid connection according to some embodiments of the present disclosure.

FIG. 7 illustrates a schematic diagram showing another exemplary household microgrid connection according to some embodiments of the present disclosure. In this example as shown in FIG. 7, the utility grid feeds into the meter combo load center. The meter combo load center includes the meter socket, MSA that plugs into the meter socket, the electricity meter that plugs into MSA, the main circuit breaker, the branch circuit breakers, and a built-in EMS. No MID is connected to MSA.

In some embodiments, the electricity flows into the meter socket from the utility grid, passes through MSA, passes through the electricity meter, and returns to MSA and the meter socket. EMS obtains the status of the utility grid through CT disposed in MSA. In response to the status of the utility grid being normal, EMS controls the switch in MSA to connect the electrical connection between the utility grid and the household microgrid. In response to the status of the utility grid being abnormal, EMS controls the switch in MSA to disconnect the electrical connection between the utility grid and the household microgrid. In the meantime, BESS is connected to the household microgrid through the branch circuit breaker. EMS communicates with BESS through a wired or a wireless connection to monitor and manage BESS along with the solar panel PV that is connected to BESS. In this case, the electricity generated by the solar panel PV feeds into BESS, passes through the branch circuit breaker in the meter combo load center, goes back into another branch circuit breaker and then the household loads. Alternatively, the electricity from the battery in BESS feeds into the household microgrid.

In the embodiments of the present disclosure, MSA and MID together provide an efficient and cost-effective way of connecting a solar power generation system (i.e., BESS, solar PV, etc.) into the household microgrid. MID includes a switch/relay to connect to the solar inverter. When the main panel capacity is insufficient, the solar energy may be connected to supply to the household loads. At the same time, when the utility grid recovers and the solar energy oversupplies, the solar inverter may be disconnected through the switch/relay.

Figure 8:
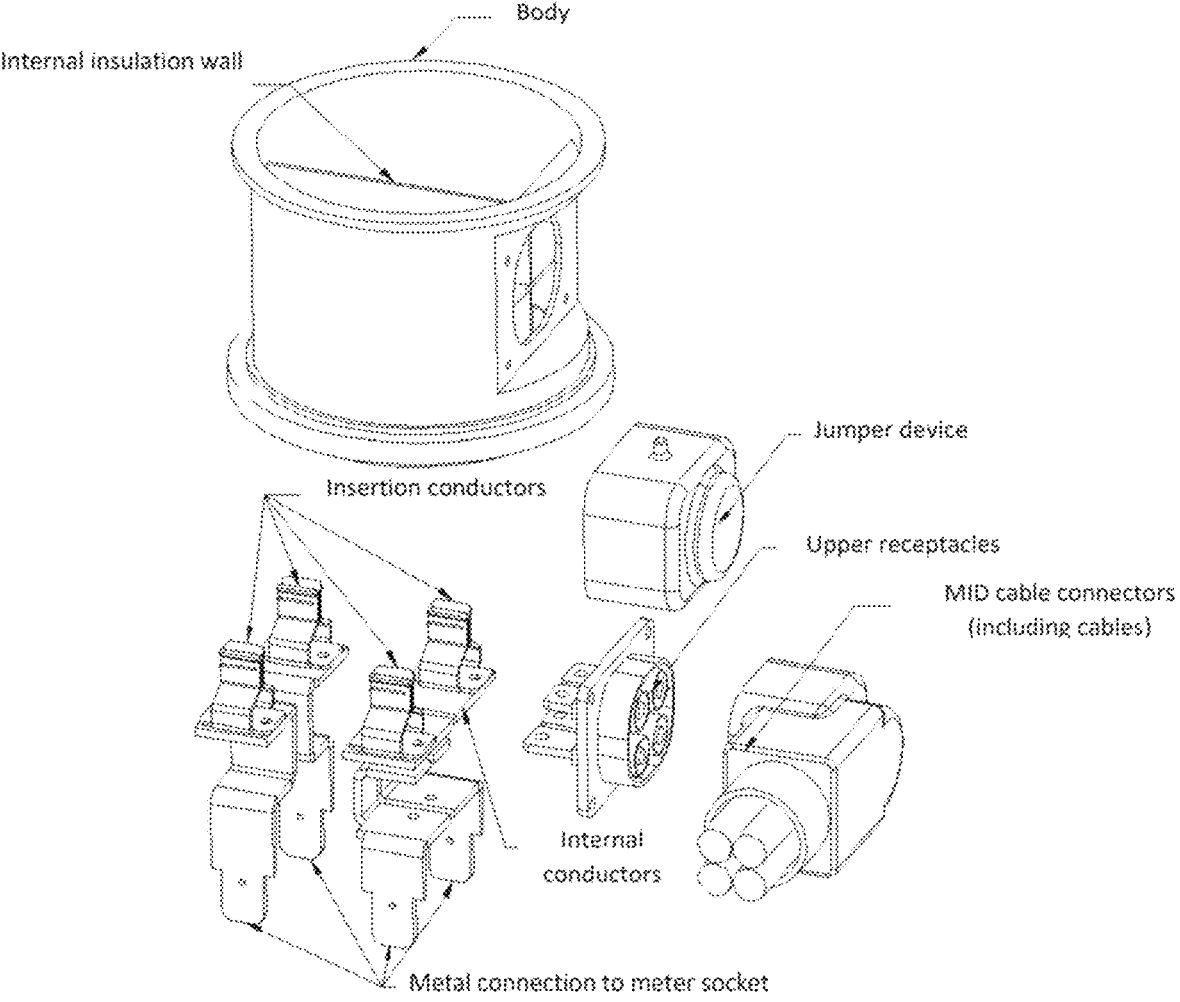
FIG. 8 illustrates a schematic diagram of an exemplary meter socket adapter according to some embodiments of the present disclosure.

FIG. 8 illustrates a schematic diagram of an exemplary meter socket adapter (MSA) according to some embodiments of the present disclosure. As shown in FIG. 8, MSA includes a body, a metal structure for connecting to the meter socket at the bottom and receiving the electricity meter at the top, and an upper receptacle that is able to receive either MID cable connectors for connecting to electrical cables or a jumper device in absence of the MID cable connectors. The upper receptacle may be mounted on a side of the body of MSA. In some embodiments, the MID cable connectors may also include the electrical cables. The other ends of the electrical cables may include standard connectors that can be plugged into MID. The length of the electrical cables may be determined by a distance between the meter combo load center and MID. In some embodiments, when MID needs to be disconnected, the MID cable connectors may be removed from MSA, and the jumper device may be plugged into the upper receptacle instead. The jumper device bypasses the electrical connection reserved for MID, such that the meter combo load center can provide its function without MID.

Figure 9:
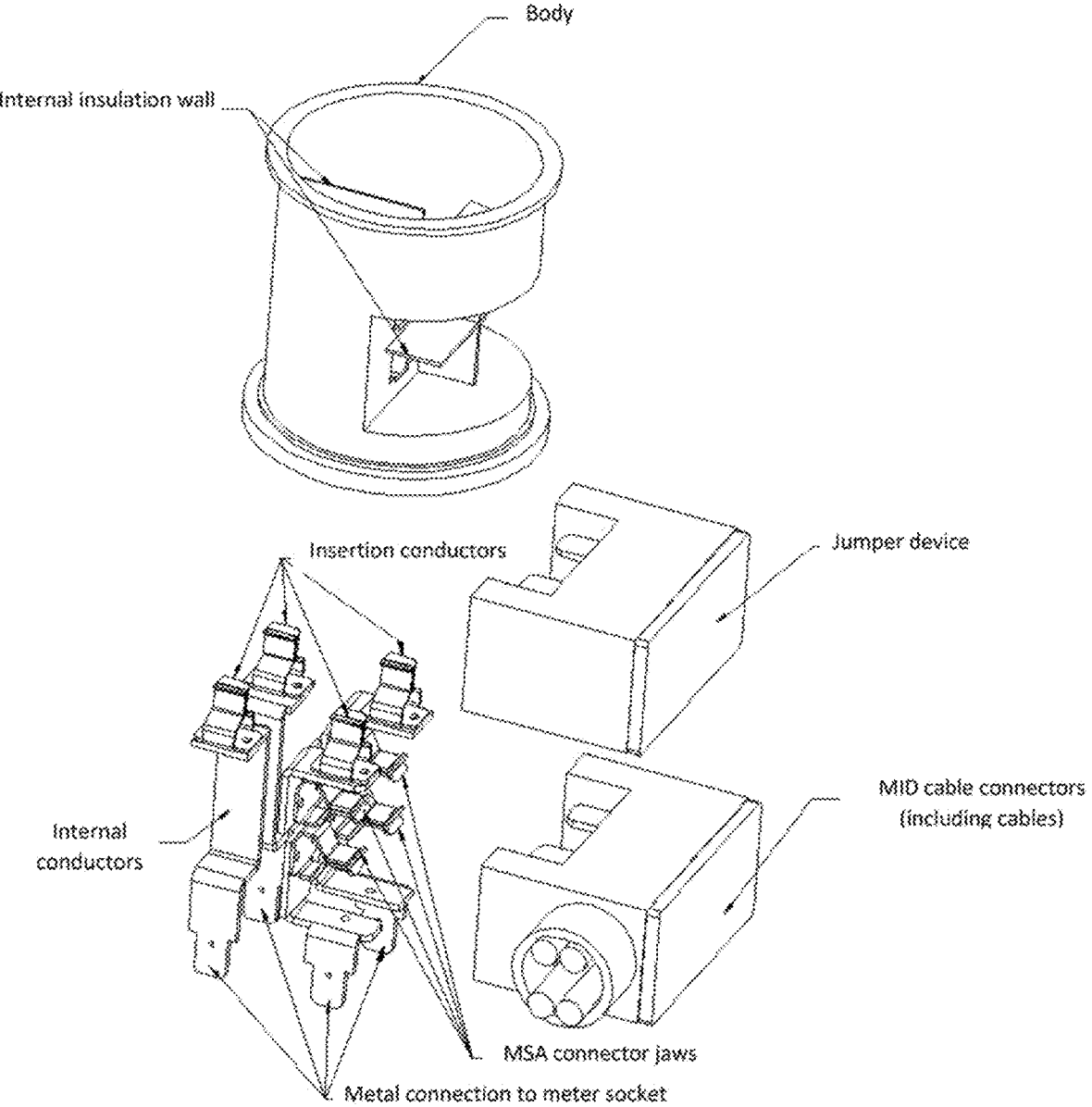
FIG. 9 illustrates a schematic diagram of another exemplary meter socket adapter according to some embodiments of the present disclosure.

FIG. 9 illustrates a schematic diagram of another exemplary meter socket adapter (MSA) according to some embodiments of the present disclosure. MSA shown in FIG. 9 is similar to MSA shown in FIG. 8. As shown in FIG. 9, MSA includes a body, a metal structure for connecting to the meter socket at the bottom, receiving the electricity meter at the top, and receiving either MID cable connectors or a jumper device on its side. In this case, the upper receptacle is not needed to receive either MID cable connectors for connecting to the electrical cables or the jumper device in absence of the MID cable connectors. The MID cable connectors or the jumper device may be directly connected to the metal structure inside the body of MSA. In some embodiments, the MID cable connectors may also include the electrical cables. The other ends of the electrical cables may include standard connectors that can be plugged into MID. The length of the electrical cables may be determined by a distance between the meter combo load center and MID. In some embodiments, when MID needs to be disconnected, the MID cable connectors may be removed from MSA, and the jumper device may be plugged into the side of the body of MSA. The jumper device bypasses the electrical connection reserved for MID, such that the meter combo load center can provide its function without MID.

MSA may be sold and used separately, and may be configured with MID provided by the present disclosure or an existing MID from a third party. The CTs may be configured in MSA or in MID.

The switch in MID may be a switch, such as a relay, a contactor, a transfer switch, etc., capable of connecting or disconnecting the electrical connection flowing back to MSA. The energy management system (EMS) may be configured in MID or in MSA. EMS and BESS may be connected through wired or wireless communication.

EMS is an energy monitoring device for the entire household microgrid. EMS controls the loads of the household microgrid to connect to or disconnect from the utility grid.

EMS can detect whether the mains voltage is normal. When the mains power fails, the EMS controls the switch to open, such that BESS is isolated from the abnormal utility grid and supplies power to the household loads. When the mains power is restored, EMS controls the switch to close, such that the household loads can be directly powered by the utility grid, and BESS can be connected to the utility grid for charging and discharging.

EMS inspects the entire household microgrid. EMS measures the electrical current flowing through MSA and/or MID through CTs and calculates the power input from the utility grid and the power output (e.g., the solar generated energy) to the utility grid. EMS can be configured to perform measurements with the CTs that measure the output current of the solar energy generation system and can calculate the photovoltaic capacity of the solar energy generation system. EMS connects to BESS through wired or wireless communication methods, and can obtain the charging and discharging power of BESS. EMS can obtain a power consumption status of the household loads through measurement and calculation.

In the case of connecting to the utility grid, EMS obtains information about the utility grid, BESS, the photovoltaic, and the household loads, and based on electricity pricing information of the utility service provider, controls the charging and discharging power of BESS through communication, and implements corresponding energy dispatch strategies, such as self-generation for self-usage, time of use (TOU) electricity rate, and peak demand, to obtain energy cost reduction benefits for households.

In some embodiments, a power line of BESS may be directly connected to the meter combo load center or to a backend of MID. BESS may also be connected to a photovoltaic (PV) input, and a PV DC power may be used to charge the battery in BESS or directly inverted into an AC output. BESS is a core energy/power provider of the household microgrid.

Figure 10:
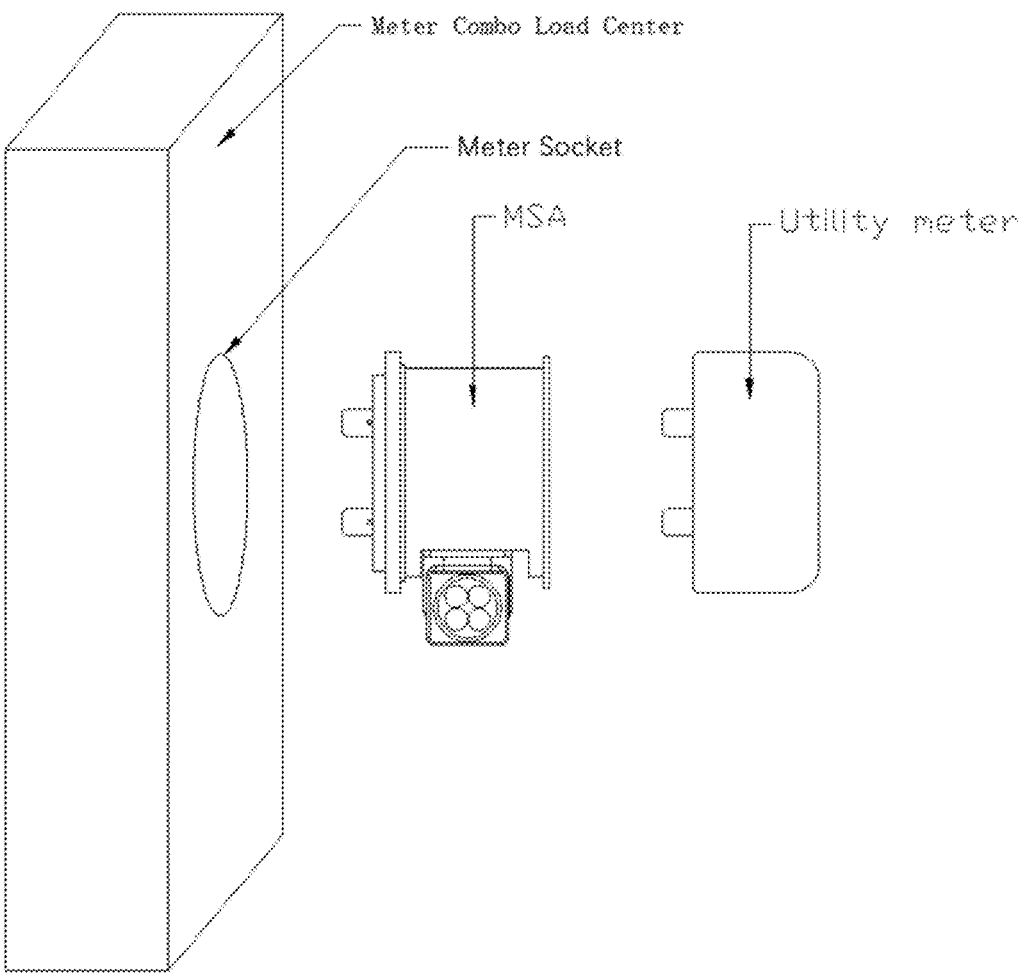
FIG. 10 illustrates a schematic diagram of retrofitting an existing meter combo load center using a meter socket adapter according to some embodiments of the present disclosure.

FIG. 10 illustrates a schematic diagram of retrofitting an existing meter combo load center using a meter socket adapter (MSA) according to some embodiments of the present disclosure.

In some embodiments, BESS is connected into the household microgrid in the following process. The electricity meter from the meter combo load center is removed. MSA is inserted into the meter socket on the meter combo load center. The electricity meter is inserted back into a meter socket on MSA. MID is connected to MSA through the electrical cables. Controlled by EMS, BESS is connected to the household microgrid through MID and MSA. As a result, the household microgrid includes the PV (i.e., the solar panels) and BESS.

The features disclosed in the product embodiments provided in the present disclosure may be combined arbitrarily without conflict to obtain new product embodiments.

The features disclosed in the method or device embodiments provided in the present disclosure may be combined arbitrarily without conflict to obtain new method embodiments or device embodiments.

Figure 11:
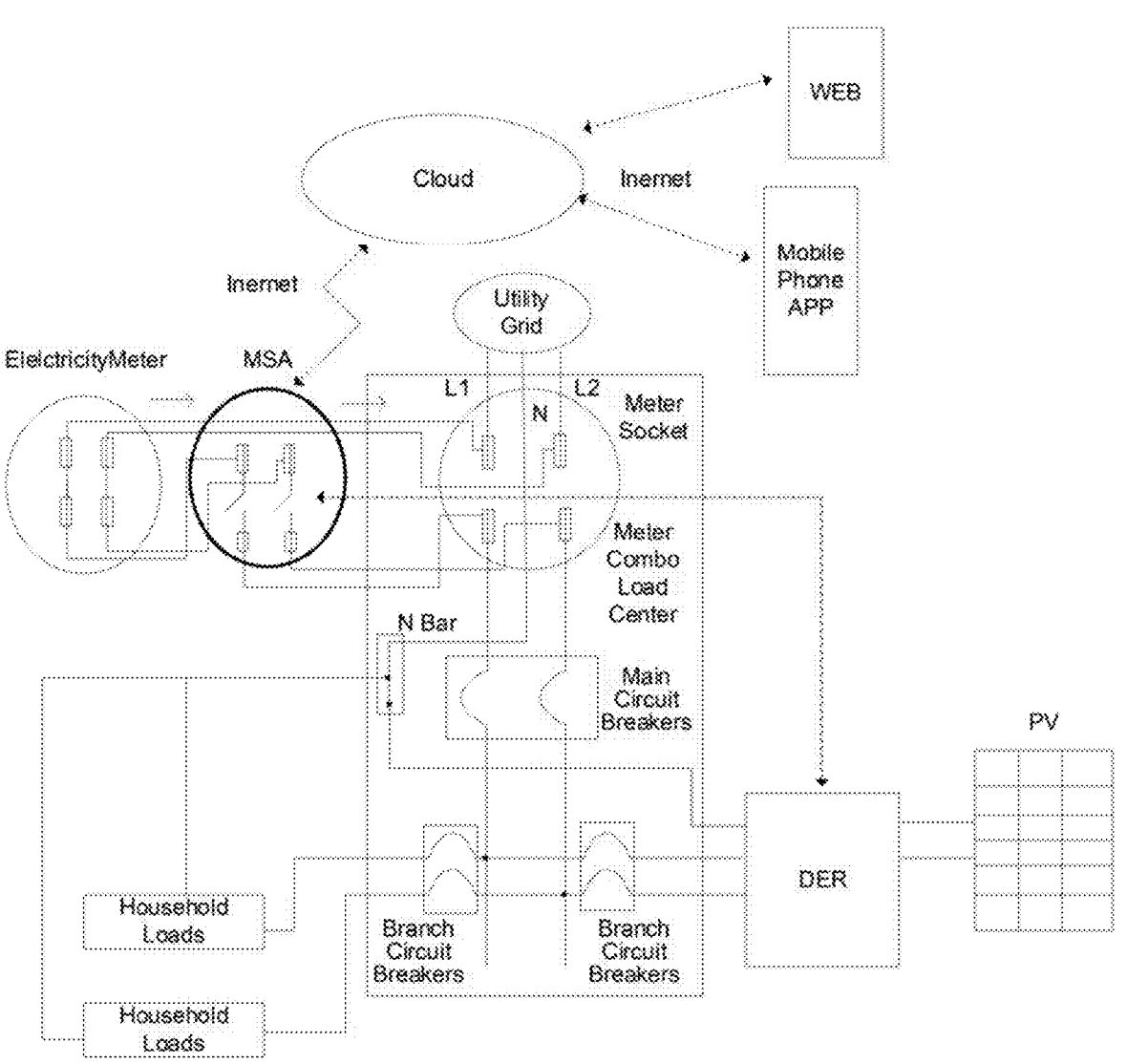
FIG. 11 illustrates a schematic diagram of interconnection between a household microgrid and a utility grid according to some embodiments of the present disclosure.

FIG. 11 illustrates a schematic diagram of interconnection between a household microgrid and a utility grid according to some embodiments of the present disclosure.

As shown in FIG. 11, the meter combo load center is a convenient and space-saving option and is often used in new constructions and as part of electrical service upgrades. The meter combo load center is commonly used in the US market and is popular specially in the state of California. According to the statics provided by interviewed installers in the state of California, approximately 90% of residential customers of utility services have the meter combo load center installed at their homes. About 25% of the installed meter combo load centers are SQUARE-D meter combo load centers.

In some embodiments, the meter combo load center often includes the electricity meter connected between the utility grid and the household microgrid. The household microgrid interconnects between power sources from the utility gird and/or a distribution energy resource (DER) and the household loads such as lightings, appliances, computers, and HVAC.

As shown in FIG. 11, the utility grid feeds into the meter combo load center through three leads, i.e., L1, L2, and N (for neutral). The meter combo load center further includes the main circuit breaker, and two or more branch circuit breakers. The electricity supply from the utility grid flows into the meter socket in the meter combo load center, passes through the electricity meter and MSA, returns to the meter socket, continues to the main circuit breakers, feeds into one or more household microgrids through one or more branch circuit breakers, and feeds DER through another branch circuit breaker. Alternatively, DER may feed the electricity generated locally and/or stored in its battery back into the utility grid through the same path in a reverse direction.

In some embodiments, the meter combo lead center further includes a neutral bar that ties together the neutral leads of the utility grid, the household microgrid, and DER.

For example, DER may be a battery energy storage system (BESS). BESS refers to a system that stores energy in the form of electricity in the battery for later use. BESS may be used to store excess energy generated from renewable sources like solar or wind power, and then to discharge that stored energy when needed, for example, during peak demand periods or when renewable energy generation is low. BESS may be used to provide backup power for critical household loads in homes during power outages.

As shown in FIG. 11, the solar panels or photovoltaic devices may generate the electricity that charges the battery in BESS and/or supplies the one or more household microgrids and/or feeds back into the utility grid.

In some embodiments, MSA further includes a MID controller. In response to the status of the electricity supply becoming abnormal, the MID controller is configured to control a built-in MID to disconnect and isolate from the utility grid, and to connect to BESS to provide the electricity supply to the household microgrid. The MID controller disposed at MSA may control the operation of DER in various scenarios. In addition, the operation of DER may be controlled remotely by the user or the owner of the meter combo load center through a web portal or a mobile phone application program (APP). In this case, the web portal or the mobile phone application program is connected to the MID controller in MSA through Internet. The user may view statuses of the utility grid, the power generation at DER, the energy storage in the battery of DER, and combined household loads, etc. Based on the statuses, the user may decide how the electricity flows in the meter combo load center. Alternatively, the user may configure various rules in advance in the MID controller, and the MID controller may decide how the electricity flows in the meter combo load center based on the pre-configured rules.

The electricity meter is plugged into the meter socket in the meter combo load center. The meter combo load center further includes MSA disposed between the electricity meter and the meter socket. MSA includes the built-in MID. MID is a piece of equipment that facilitates connection of the household microgrid to the larger utility grid or to other microgrids. It manages the flow of electricity between the household microgrid and the utility grid, ensuring that electric power is exchanged efficiently and safely. MID plays a crucial role in enabling the integration of DER, e.g., solar panels and wind turbines, into a broader grid infrastructure. MID includes protective and control functions to ensure stable and reliable operation of the interconnected systems. In case of failure of the utility grid, MID may disconnect and isolate the utility grid from the household microgrid and may connect BESS to supply electricity to the household microgrid.

In some embodiments, MSA further includes a monitoring circuit to monitor a status of the electricity supply from the utility grid. The status of the electricity supply includes at least a voltage, a current, and a frequency of the electricity supply.

MSA may further includes an EMS controller. The EMS controller is configured to communicate with the MID controller to obtain usage information at an entry of the electricity supply from the utility grid and communicate with DER to obtain power generation information. Based on the usage information, the power generation information, an electricity supply rate, and grid connection requirements, the EMS controller is further configured to control DER to supply the generated electricity to the utility gird and/or the household microgrid.

The EMS controller is further configured to upload operation data of the household microgrid to a remote server (not shown), and to facilitate the user to remotely monitor, configure, and control devices connected on the household microgrid.

Figure 12:
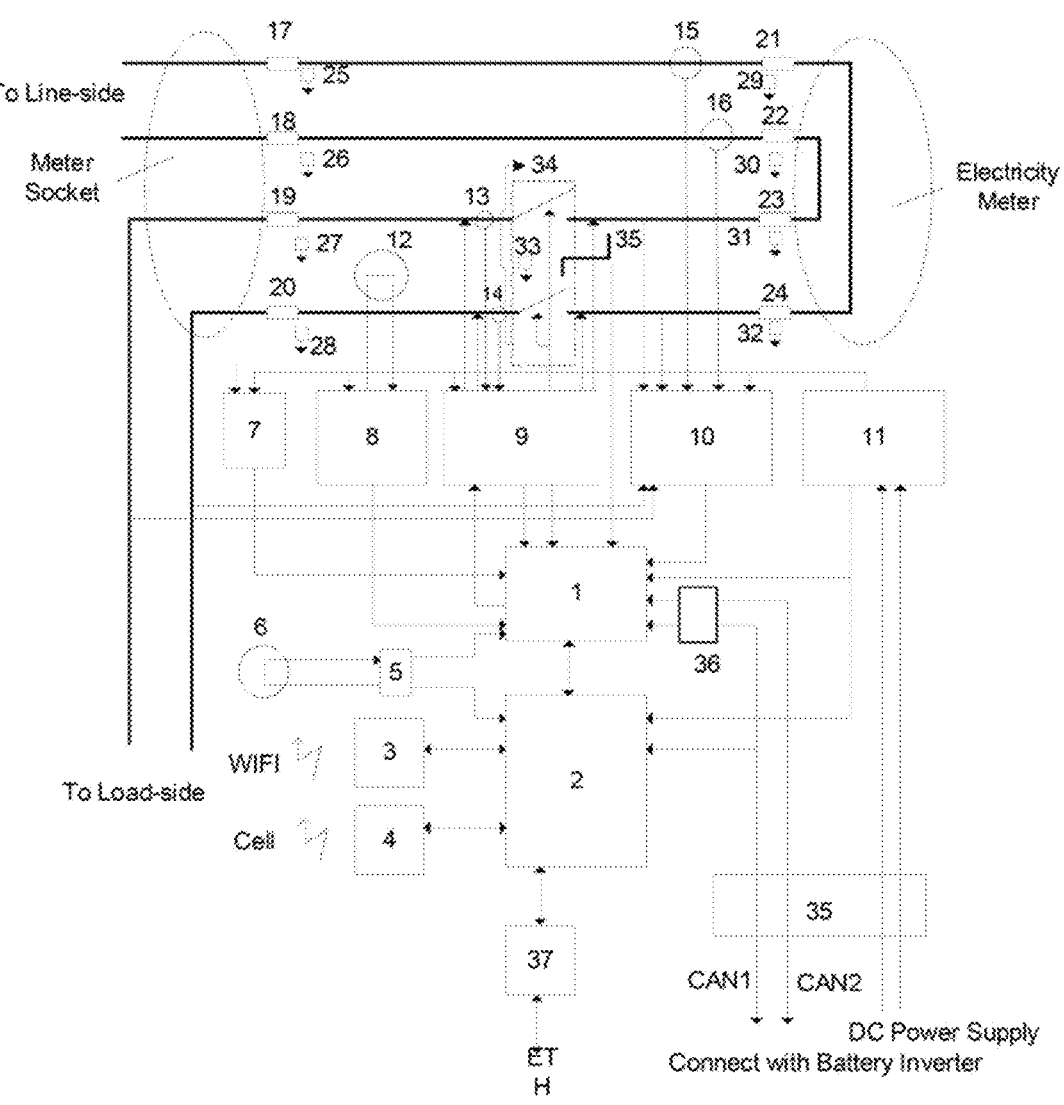
FIG. 12 illustrates a structural schematic diagram of an exemplary MSA according to some embodiments of the present disclosure.
Figure 13:
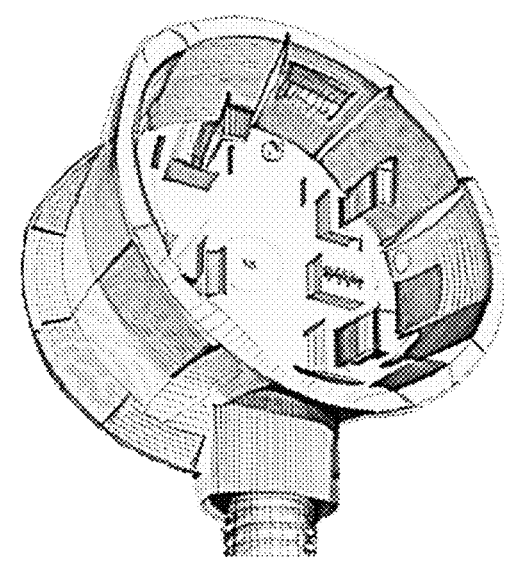
FIG. 13 illustrates a schematic diagram of a housing of an MSA according to some embodiments of the present disclosure.

FIG. 12 illustrates a structural schematic diagram of an exemplary MSA according to some embodiments of the present disclosure. MSA is disposed between the electricity meter and the meter socket. MSA includes a housing as shown in FIG. 13. The electricity meter may be a TYPE 2S electricity meter. The housing conforms to UL414 standard.

As shown in FIG. 12, MSA includes the EMS controller 1 and the MID controller 2 as described previously. MSA further includes various communication interfaces that are connected to the MID controller 2 to gain Internet access. For example, MSA includes a Wi-Fi interface 3 to gain Internet access through a home router and a cellular network interface 4 to gain Internet access through a cellular service provider's network (e.g., Verizon, AT&T, T-Mobile). MSA also includes an Ethernet interface 37 and a CAN bus interface 36 to connect to other devices connected on the household microgrid, for example, BESS.

MSA further includes a reset button 6 that allows a user to reset the MSA and a reset circuit 5 that allows the processors in the EMS controller 1 and the MID controller 2 to recover from deadlocks.

MSA further includes temperature sensors 25-33 disposed at each high current connection point to monitor temperatures, and a thermal management circuit 7 coupled with the temperature sensors 25-33 to prevent overheat. For example, when the temperature at a high current connection point exceeds a preset temperature threshold, the thermal management circuit 7 is triggered to notify the EMS controller 1 such that the EMS controller 1 can take action to limit the current that passes through the high current connection. The number of the temperature sensors may be adjusted according the actual needs, which is not limited by the present disclosure.

MSA further includes a meter detection circuit 8 and a microswitch 12 to detect whether the electricity meter is inserted into MSA. For example, when the electricity meter is fully inserted into MSA, the microswitch 12 may change from an open state to a closed state. The meter detection circuit 8 detects the closed state of the microswitch 12 and determines that the electricity meter is fully inserted into MSA. When the electricity meter is not fully inserted into MSA, the microswitch 12 remain in the open state. The meter detection circuit 8 detects the open state of the microswitch 12 and determines that the electricity meter is not fully inserted into MSA. When a change of the state of the microswitch 12 is detected by the meter detection circuit 8, the meter detection circuit 8 reports the current state of the microswitch 12 to the EMS controller 1.

MSA further includes a built-in MID 34 and a manual switch 35 to manually close or disconnect MID in case of emergency. For example, a residential home served by the household microgrid is damaged by extreme weather, the home owner can operate the manual switch 35 to manually shut down all power to the microgrid to avoid potential hazards caused by short circuits.

In some embodiments, MID is an actuator that disconnects and connects electrical connections between the household microgrid and the utility grid. MID may be a magnetic latching power relay.

MSA further includes a MID connection detection and driver circuit 9, and MID connection sensors 13, 14 to verify electrical connections with the built-in MID 34. For example, the MID connection sensors 13, 14 detect the electrical current at their corresponding electrical connections. The MID connection sensors 13, 14 are connected to the MID connection detection and driver circuit 9. When an electrical current is detected by the MID connection sensors 13, 14 at their corresponding electrical connections, the MID connection detection and driver circuit 9 determines that the switches in MID 34 are closed. In other words, the utility grid and the household microgrid are connected by MID 34. When no electrical current is detected by the MID connection sensors 13, 14 at their corresponding electrical connections, the MID connection detection and driver circuit 9 determines that the switches in MID 34 are open. In other words, the utility grid and the household microgrid are disconnected by MID 34.

MSA further includes a metering circuit 10 and metering sensors 15, 16 to measure the electricity supply from the utility grid. The metering sensors 15, 16 measure electrical parameters of the electricity supply from the utility grid. The electrical parameters may include a voltage, a current, a frequency of the electricity supply from the utility grid. The metering sensors 15, 16 are connected to the metering circuit 10. The metering circuit 10 obtains the raw measurements of the electrical parameters from the metering sensors 15, 16 and reports them to the EMS controller 1. The number and types of the metering sensors 15, 16 may be determined according to the actual needs, which is not limited by the present disclosure.

MSA further includes a power supply circuit (not shown) to supply power to various circuits in MSA. When the utility grid is normal, the power supply circuit may draw from the electricity supply from the utility grid, and may convert the electricity supply into various DC voltages to power the circuits in MSA. When the utility grid is abnormal, the power supply circuit may draw DC power from the battery inverter in BESS, and may convert the electricity supply into various DC voltages to power the circuits in MSA.

MSA further includes four front power conductors 21-24 and four rear power conductors 17-20. As shown in FIG. 12, the four front power conductors 21-24 connect to the electricity meter, and four temperature sensors 29-32 are collocated with the four front power conductors 21-24 to measure the corresponding temperatures, such that overheating can be prevented. The rear power conductors 17-18 are connected to the line-side, i.e., the utility grid, through the meter socket, and the rear power conductors 19-20 are connected to the load-side, i.e., the household microgrid, through the meter socket. Four temperature sensors 25-28 are collocated with the four rear power conductors 17-20 to measure the corresponding temperatures, such that overheating can be prevented.

Functions of MSA are further described below with reference to the drawings.

MSA supports a function of detecting closed/disconnected position of a latching power relay and verifying electrical connections with MID. In addition to the latching power relay, MID also includes an auxiliary contact. The auxiliary contact is mechanically interlocked with the closed/disconnected position of a power main contact. When the latching power relay is in the closed state, the auxiliary contact is often used to detect whether the relay main contact is open or conducting. However, this detection method may not accurately detect the electrical connection or disconnection state of MID. In one example, MID may have a mechanical failure, resulting in the auxiliary contact not being able to truly reflect the position of the main contact. In another example, the surface of the main contact may be covered by an oxide film or contaminant particles. Even if the main contact is mechanically closed, it may not be electrically conductive. In another example, electrical isolation surrounding the main contact may be broken down (i.e., carbonization on an in-stroke path). After main contact is mechanically disconnected, the main contact is still electrically connected.

The present disclosure provides a circuit that does not rely on the auxiliary contact to accurately detect an electrical connection or disconnection state of MID. The circuit for detecting the electrical connection state of MID will be described in detail below with reference to the drawings thereof.

Figure 14:
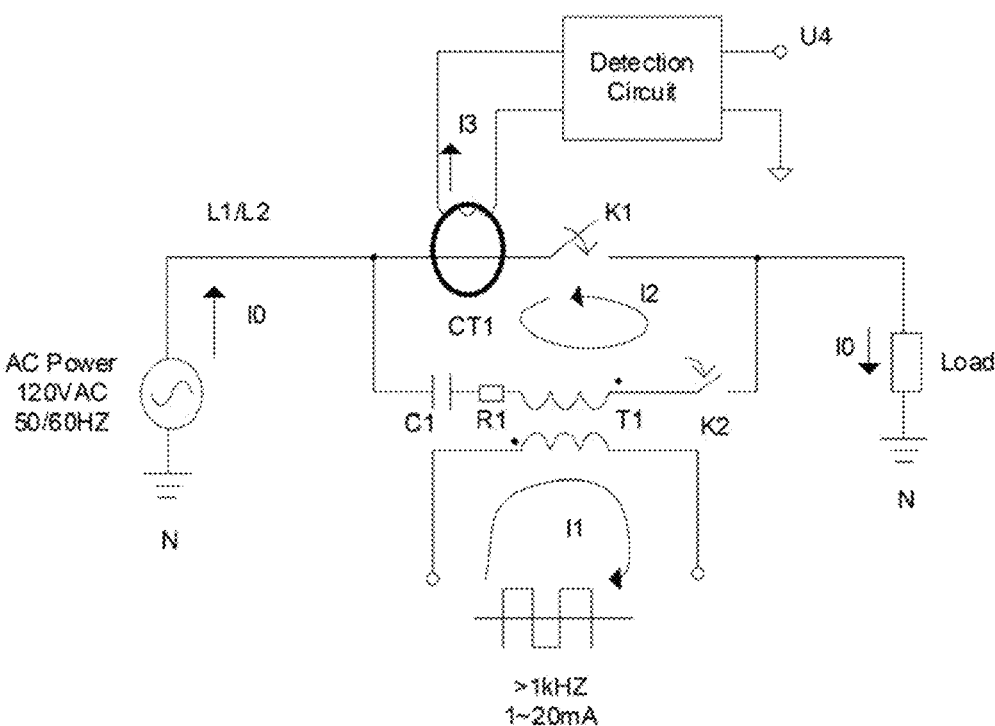
FIG. 14 illustrates a schematic diagram of an exemplary circuit for detecting a position of a latching power relay and verifying electrical connections according to some embodiments of the present disclosure.

FIG. 14 illustrates a schematic diagram of an exemplary circuit for detecting a position of a latching power relay and verifying electrical connections according to some embodiments of the present disclosure. As shown in FIG. 14, the circuit includes an AC power source and a load. The AC power source supplies a current I0 to the load through a main contact of MID, i.e., a switch K1. The switch K1 is connected in parallel with a circuit including a capacitor C1, a resistor R1, a secondary coil of a transformer T1, and switch K2 that are connected in series. A square wave signal with a current ranging between 1 mA and 20 mA and a frequency greater than 1 kHz is applied to a primary coil of the transformer T1. A current transformer CT1 transfers a current signal I2 into a current signal I3 that is fed to a detection circuit.

The present disclosure provides a method of detecting the electrical connection state of MID using the circuit shown in FIG. 14. The method does not rely on the auxiliary contact to accurately detect the electrical connection or disconnection state of MID.

Figure 15:
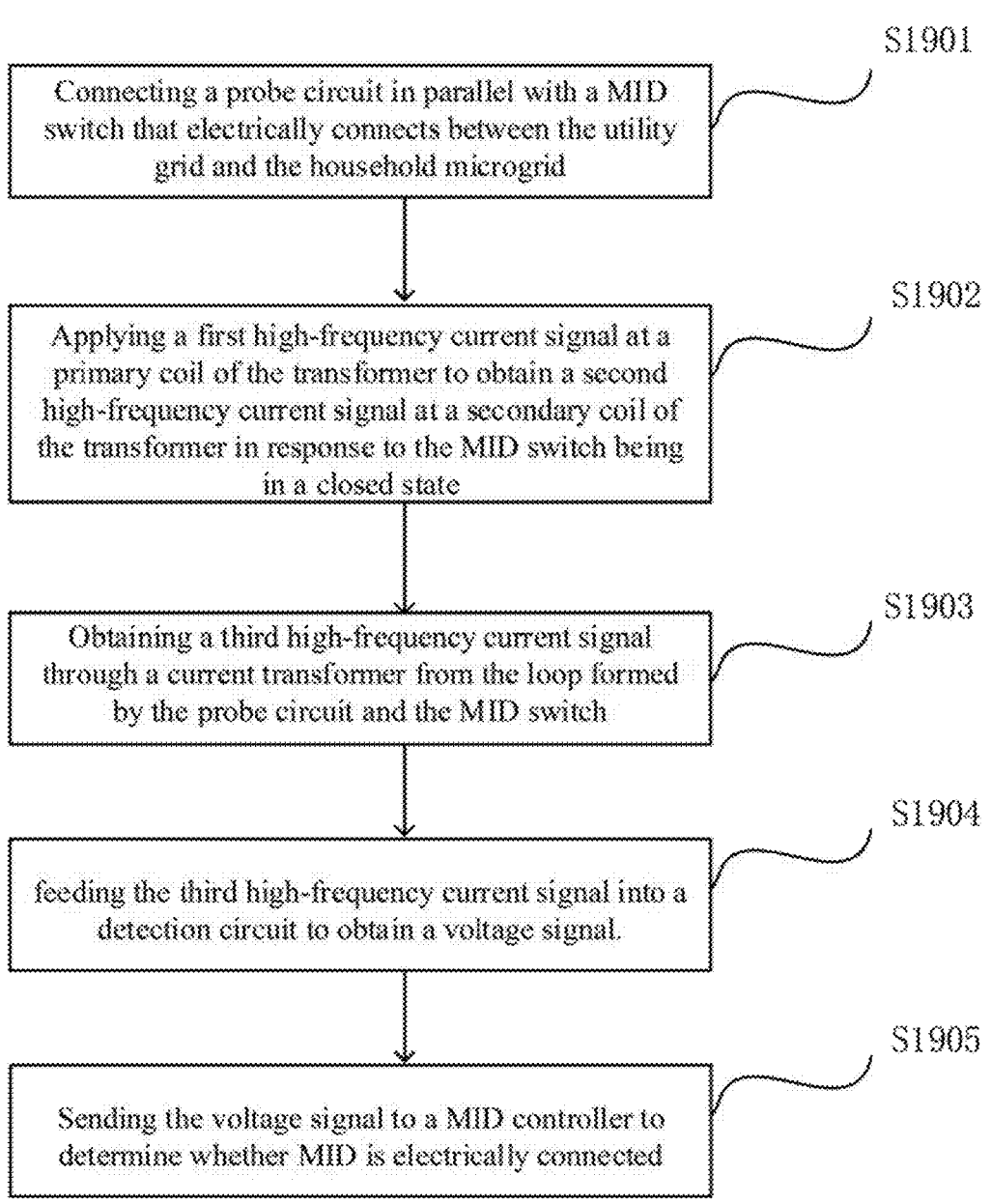
FIG. 15 illustrates a flowchart for an exemplary method of detecting the electrical connection state of MID according to some embodiments of the present disclosure.

FIG. 15 illustrates a flowchart for an exemplary method of detecting the electrical connection state of MID according to some embodiments of the present disclosure. As shown in FIG. 15, the method for accurately detecting the electrical connection or disconnection state of MID includes the following processes.

At S1901, connecting a probe circuit in parallel with a MID switch that electrically connects between the utility grid and the household microgrid, where the probe circuit includes a capacitor, a resistor, and a secondary coil of a transformer that are connected in series.

Referring to FIG. 14, the probe circuit includes the capacitor C1, the resistor R1, and the secondary coil of the transformer T1. When the switch K2 is closed, the circuit is connected in parallel with the main contact of MID, i.e., the switch K1 or the MID switch.

At S1902, applying a first high-frequency current signal at a primary coil of the transformer to obtain a second high-frequency current signal at a secondary coil of the transformer in response to the MID switch being in a closed state, where the first high-frequency current signal and the second high-frequency current signal have a same frequency, the second high-frequency signal circulates in a loop formed by the probe circuit and the MID switch.

Referring to FIG. 14, the square wave signal I1 with the current ranging between 1 mA and 20 mA and the frequency greater than 1 kHz is applied to the primary coil of the transformer T1. When the switch K1 is in the closed state, a high-frequency current signal I2 at a same frequency as the square wave signal I1 is coupled to the secondary coil of the transformer T1. The high-frequency current signal I2 circulates in the loop formed by the probe circuit and the K1 switch.

At S1903, obtaining a third high-frequency current signal through a current transformer from the loop formed by the probe circuit and the MID switch.

Referring to FIG. 14, a high-frequency current signal I3 is sensed by the current transformer CT1 sleeved on an output power conductor of MID.

At S1904, feeding the third high-frequency current signal into a detection circuit to obtain a voltage signal.

Referring to FIG. 14, the high-frequency current signal I3 passes through the detection circuit including a high-pass filter and a signal conditioning circuit to output the voltage signal U4.

Figure 16:
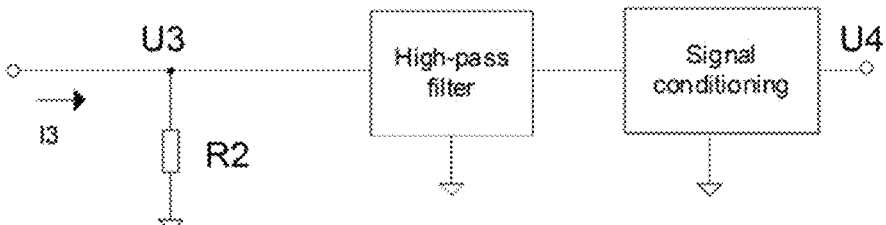
FIG. 16 illustrates a schematic diagram of an exemplary detection circuit according to some embodiments of the present disclosure.

FIG. 16 illustrates a schematic diagram of an exemplary detection circuit according to some embodiments of the present disclosure. As shown in FIG. 16, the high-frequency current signal I3 is applied to a resistor R2 to obtain a voltage signal U3. The voltage signal U3 passes through a high-pass filter and a signal conditioning circuit to obtain the voltage signal U4.

Referring back to FIG. 15, at S1905, sending the voltage signal to a MID controller to determine whether MID is electrically connected.

Referring back to FIG. 14, the voltage signal U4 is sent to the MID controller to determine whether MID is electrically connected or disconnected.

The present disclosure also provides a safety protection mechanism in case the electricity meter is accidentally removed while being supplied with power.

Figure 17:
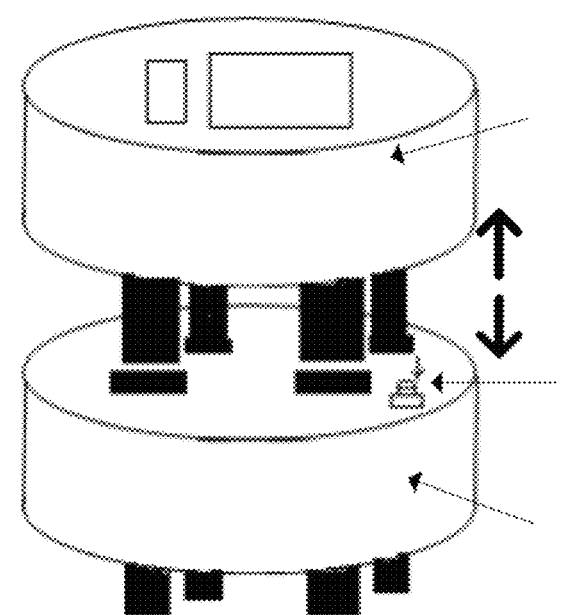
FIG. 17 illustrates a schematic diagram showing a safety protection mechanism of MSA according to some embodiments of the present disclosure.

FIG. 17 illustrates a schematic diagram showing a safety protection mechanism of MSA according to some embodiments of the present disclosure. As shown in FIG. 17, MSA includes a meter detection circuit for detecting insertion or removal of the electricity meter.

In some embodiments, the meter detection circuit monitors a contact switch disposed on a side of MSA facing toward the electricity meter. The insertion of the electricity meter presses the contact switch to enter a closed state, and the removal of the electricity meter releases the contact switch to enter an open state. When the meter detection circuit detects that the contact switch changes from the closed state to the open state, the meter detection circuit determines that the electricity meter is inserted into MSA, and energizes conductors exposed on the side of MSA facing toward the electricity meter for receiving the electricity meter. When the meter detection circuit detects that the contact switch changes from the open state to the closed state, the meter detection circuit determines that the electricity meter is removed from MSA, and de-energizes the conductors exposed on the side of MSA facing toward the electricity meter for receiving the electricity meter.

In a normal operation, before the electricity meter is removed from MSA, a utility grid input terminal needs to be disconnected, the main circuit breaker needs to be turned off, and all outputs from BESS need to be turned off. Then, the electricity meter can be pulled out. However, in the case of inadvertent operation while the electricity meter is still energized and loaded, detaching the power conductors may cause an arc, resulting in safety hazards to the user. If the power conductors on MSA are exposed after the electricity meter is removed, BESS may still supply power to the household microgrid, and the user may be subject to the risk of electric shock and short circuit when touching the exposed power conductors on MSA.

Therefore, it is necessary to provide the safety protection mechanism to avoid the above risky situations. In the process of pulling out the electricity meter, the load current needs to be cut off before the power conductors are detached from MSA, and the output of BESS also needs to be stopped after the electricity meter is pulled out.

In some embodiments, the contact switch is included in MSA. When the electricity meter is inserted, the contact switch is compressed by the electricity meter structure to enter the closed state. When the electricity meter is removed, the contact switch pops up to enter the open state.

During the process of removing the electricity meter, the power conductors on the electricity meter and the power conductors on MSA remain electrically connected at first. The electricity meter structure and MSA housing are separated first to form a gap. The contact switch compressed between the electricity meter structure and the MSA housing pops up, and the contact switch changes from the closed state to the open state. A signal indicating the open state is sent to the MID controller. After receiving the signal, the MID controller sends a disconnect relay control signal to the MID switch, and the latching power relay cuts off the load current. Then the power conductors on the electricity meter and the powers conductor on MSA are disconnected at zero current to subpress the arc.

In some embodiments, as shown in FIG. 12, after the electricity meter is unplugged, the EMS controller detects that the contact switch is in the open state through the meter detection circuit 8 and immediately stops the energy storage inverter output, thereby preventing electric shock from the exposed power conductors on the side of MSA facing toward the electricity meter when the electricity meter is removed.

The present disclosure also provides a thermal management function for MSA. The power conductors in MSA carry substantially large electrical currents. The large electrical currents may cause overheat at the power conductors, connections between the power conductors, and the other components in MID. If certain electrical connections are imperfect or are subject to over-current for extensive period of time, one or more of the electricity meters, the meter socket, and MSA may be damaged due to overheat. In extreme cases, one or more of the electricity meters, the meter socket, and MSA may catch fire. On the other hand, the mechanical and electrical performance of MID may degrade due to extensive operation under substantially high temperatures. In extreme cases, MID may be damaged as a result of overheat.

Figure 18:
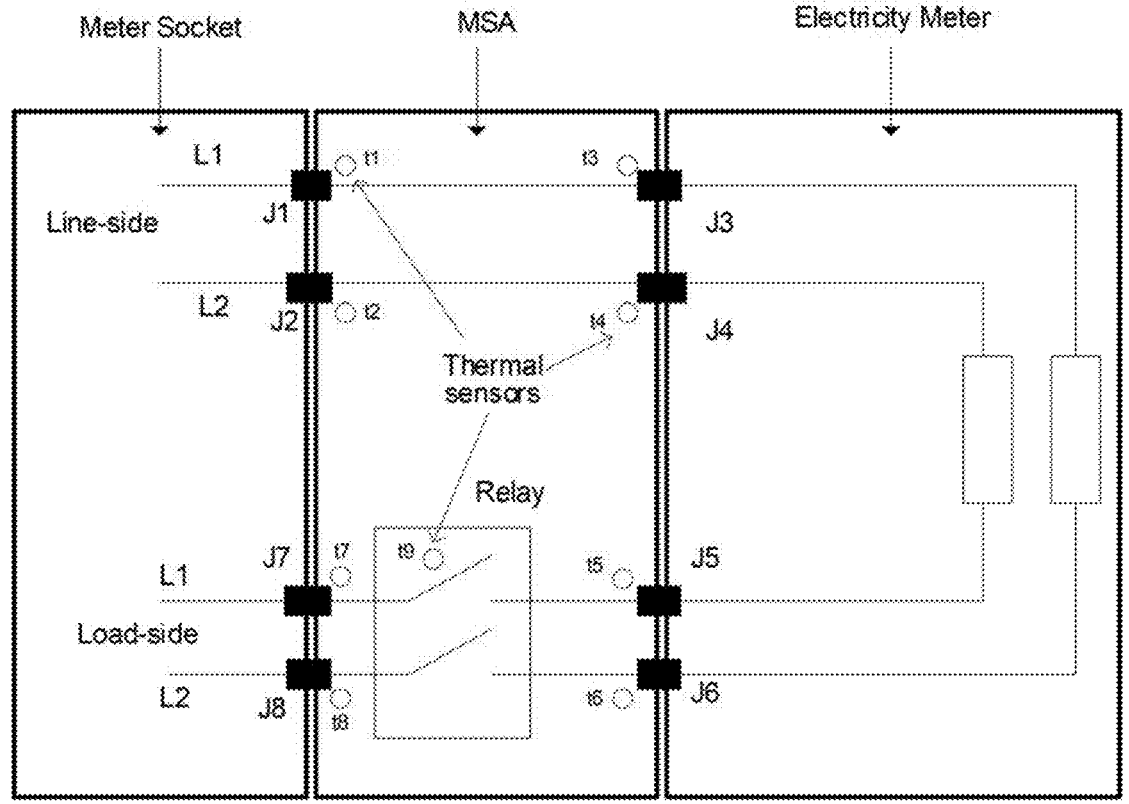
FIG. 18 illustrates a schematic diagram of a thermal management mechanism of MSA according to some embodiments of the present disclosure.

FIG. 18 illustrates a schematic diagram of a thermal management mechanism of MSA according to some embodiments of the present disclosure. As shown in FIG. 18, temperature sensors t1-t8 are configured adjacent to the connections J1-J8 between the meter socket and MSA and between MSA and the electricity meter. The temperature sensors t1-t8 measure the temperatures of the power conductors adjacent to the connections J1-J8. In addition, at least one temperature sensor t9 is disposed at the housing of the latching power relay to measure the temperature of the housing of the latching power relay.

When any of the measured temperatures exceeds a preset temperature threshold, BESS may be notified to reduce its battery charging power and/or increase the power supplied to the household loads, such that the currents passing through MSA can be reduced. When any of the measured temperatures exceeds a preset protection temperature threshold, the MID controller may be notified to disconnect the latching power relay to protect the power conductors and the latching power relay from being damaged. At the same time, BESS enters a standby mode, and the user will be notified. In the standby mode, BESS does not supply power to the household loads. When all of the measured temperatures decrease under a preset safety temperature threshold, the MID controller reconnects the latching power relay, and the user may be notified.

The present disclosure also provides a power backup function for MSA. The MID controller constantly monitors the voltage of the electricity supply from the utility grid. When the voltage is determined to be abnormal, the MID controller disconnects the electrical connection between the utility grid and the household microgrid, and notifies BESS to operate in an off-grid mode. In the off-grid mode, BESS supplies power to the household microgrid. The household microgrid operates independent of the utility grid.

When the utility grid resumes its normal operation, the MID controller controls the output of BESS to synchronize with the utility grid. After a synchronization condition is met (same frequency, same phase, and same amplitude), MID is controlled to reconnect the electrical connection between the utility grid and the household microgrid, and BESS is notified to switch to a grid-connected operation mode. The household microgrid resumes to receive the electricity supply from the utility grid. BESS may also be grid-connected to receive power from the utility grid or to transmit power to the utility grid.

In the embodiments of the present disclosure, MSA seamlessly integrates smart functions required for operating the household microgrid safely and reliably.

The present disclosure also provides an energy control method for a household microgrid.

Figure 19:
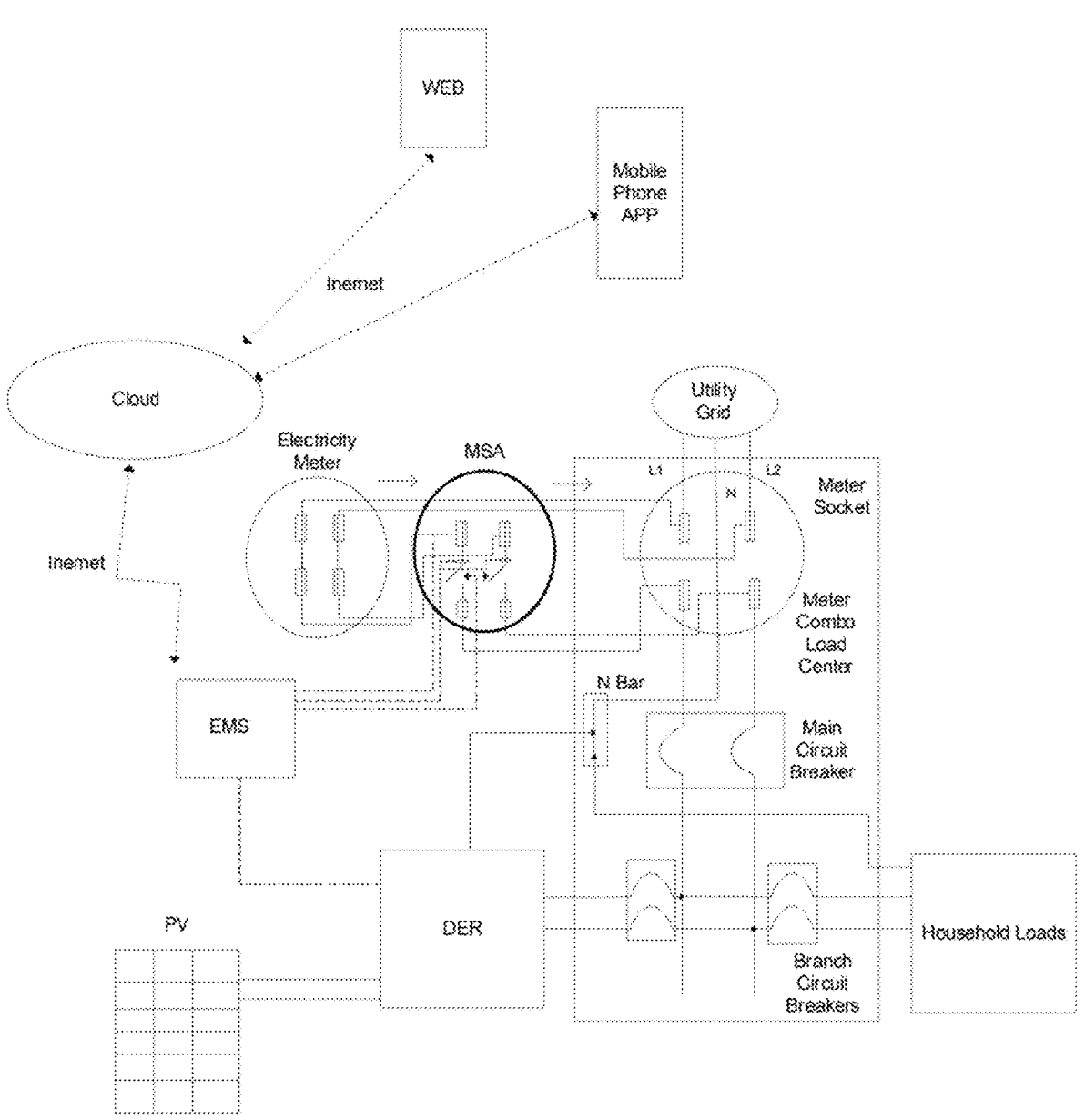
FIG. 19 illustrates a schematic diagram of a system architecture of a household microgrid according to some embodiments of the present disclosure.

FIG. 19 illustrates a schematic diagram of a system architecture of a household microgrid according to some embodiments of the present disclosure.

As shown in FIG. 19, the household microgrid is connected to a utility grid through a meter socket adapter (MSA) installed in a meter combo load center (MCLC). MCLCs are a convenient and space-saving option and are often used in new construction and as part of electrical service upgrades. MCLCs are commonly used in the US market and are popular specially in the state of California. According to the statics provided by interviewed installers, approximately 90% of residential homes will have MCLC installed. In California, 25% of the MCLCs installed are SQUARE-D MCLCs.

MCLC often includes an electricity meter connected between the utility grid and a household microgrid. The household microgrid interconnects between power sources from the utility gird and/or a distribution energy resource (DER) device, and household loads such as lightings, appliances, computers, and HVAC. The meter combo load center further includes a main circuit breaker to protect the meter combo load center from an overall over-current and one or more branch circuit breakers to protect individual household loads and the BER devices from over-current.

The DER device may be connected to a photovoltaic panel of a solar power generation system. For example, the DER device may be a battery energy storage system (BESS). BESS refers to a system that stores energy in the form of electricity in batteries for later use. BESS can be used to store excess energy generated from renewable sources like solar or wind power generators, and then discharge that stored energy when needed, such as during peak demand periods or when renewable energy generation is low. BESS can be used to provide backup power for critical loads in homes during power outages.

The electricity meter is plugged into an electricity meter socket in the meter combo load center. The meter combo load center further includes a meter socket adapter (MSA) disposed between the electricity meter and the electricity meter socket. MSA may include a built-in microgrid interconnect device (MID). MID is a piece of equipment that facilitates connection of the household microgrid to the larger utility grid or to other microgrids. It manages the flow of electricity between the household microgrid and the utility grid, ensuring that electric power is exchanged efficiently and safely. MID plays a crucial role in enabling the integration of distributed energy resources, such as solar panels and wind turbines, into the broader grid infrastructure. MID includes protective and control functions to ensure stable and reliable operation of the interconnected systems. In case of failure of the utility grid, MID may disconnect and isolate the utility grid from the household microgrid and connect BESS to supply electricity to the household microgrid.

MSA further includes a monitoring circuit to monitor a status of the electricity supply from the utility grid. The status of the electricity supply includes at least a voltage, a current, and a frequency of the electricity supply.

MSA further includes a MID controller. In response to the status of electricity supply becoming abnormal, the MID controller is configured to control the built-in MID to disconnect and isolate from the utility grid, and connect BESS to provide electricity supply to the household microgrid.

MSA further includes an energy management system (EMS) controller. The EMS controller is configured to communicate with the MID controller to obtain usage information at an entry of the electricity supply from the utility grid and the status of the electricity supply monitored by the monitoring circuit. The MES controller is further configured to communicate with the DER device to obtain power generation information. Based on the usage information, the status of the electricity supply, the power generation information, an electricity supply rate, and other grid connection requirements, the EMS controller is further configured to control the DER device to supply electric power to the utility gird and/or the household microgrid.

The EMS controller is further configured to upload operation data of the household microgrid to a remote server, and to facilitate a user of the household microgrid to remotely monitor, configure, and control devices connected on the household microgrid. The user may access the operation data stored in the remote server through a web portal or an application program on a mobile phone.

Figure 20:
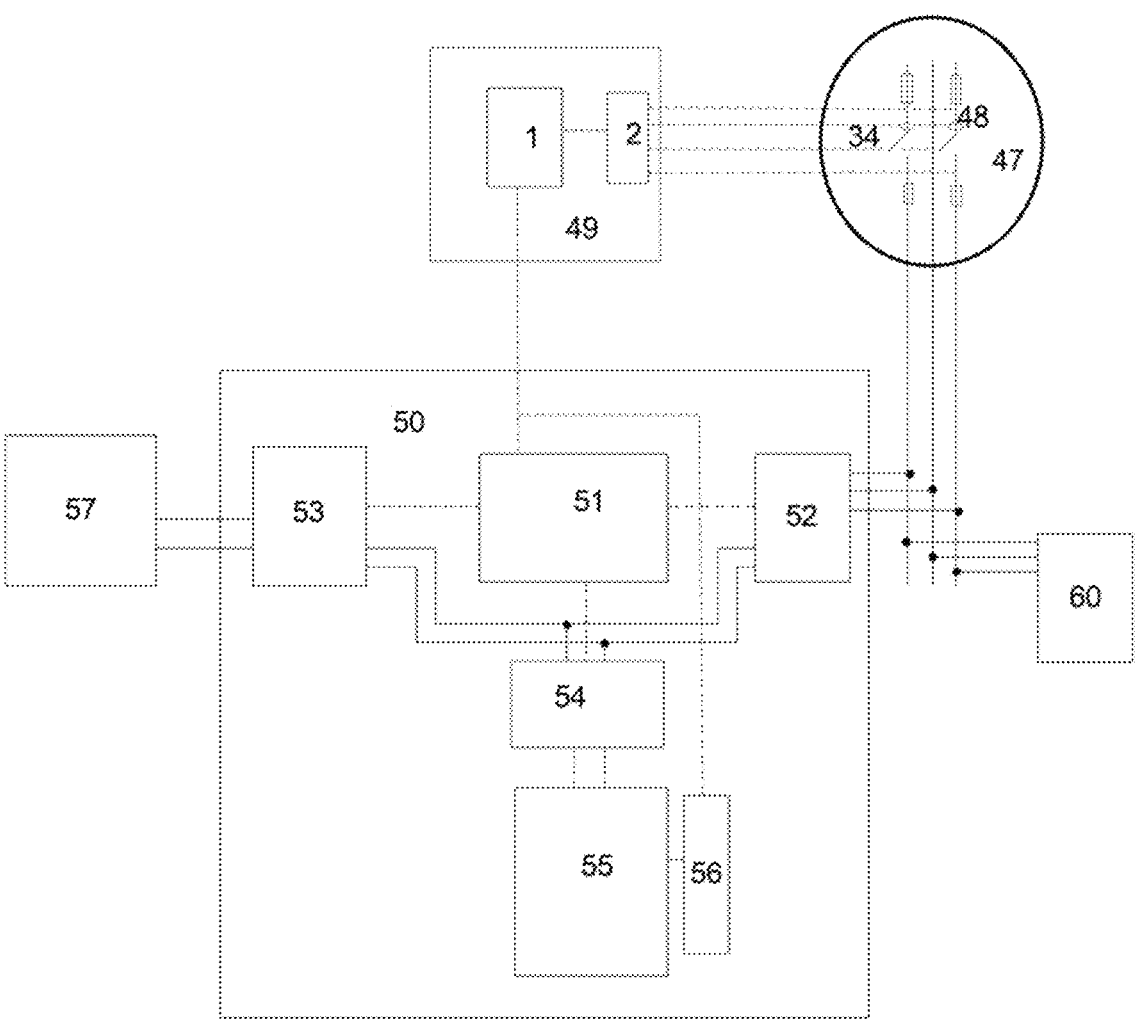
FIG. 20 illustrates a schematic diagram of a household microgrid according to some embodiments of the present disclosure.

FIG. 20 illustrates a schematic diagram of a household microgrid according to some embodiments of the present disclosure.

As shown in FIG. 20, the household microgrid includes MSA 47, EMS 49, BESS 50, and the household loads 60. MSA 47 is disposed between the electricity meter and the electricity meter socket. MSA 47 includes a voltage/current detector 48 and the built-in microgrid interconnect device (MID) 34. EMS 49 includes the MID controller 2 and the EMS controller 1 as previously described. BESS 50 includes a power control system (PCS) controller 51, an inverter 52, a maximum power point tracking (MPPT) component 53, a DC/DC converter 54, a battery 55, a battery management system (BMS) controller 56, and photovoltaic strings 57. The household microgrid shown in FIG. 20 is intended to be exemplary. More or less components may be included according to actual needs.

Figure 21:
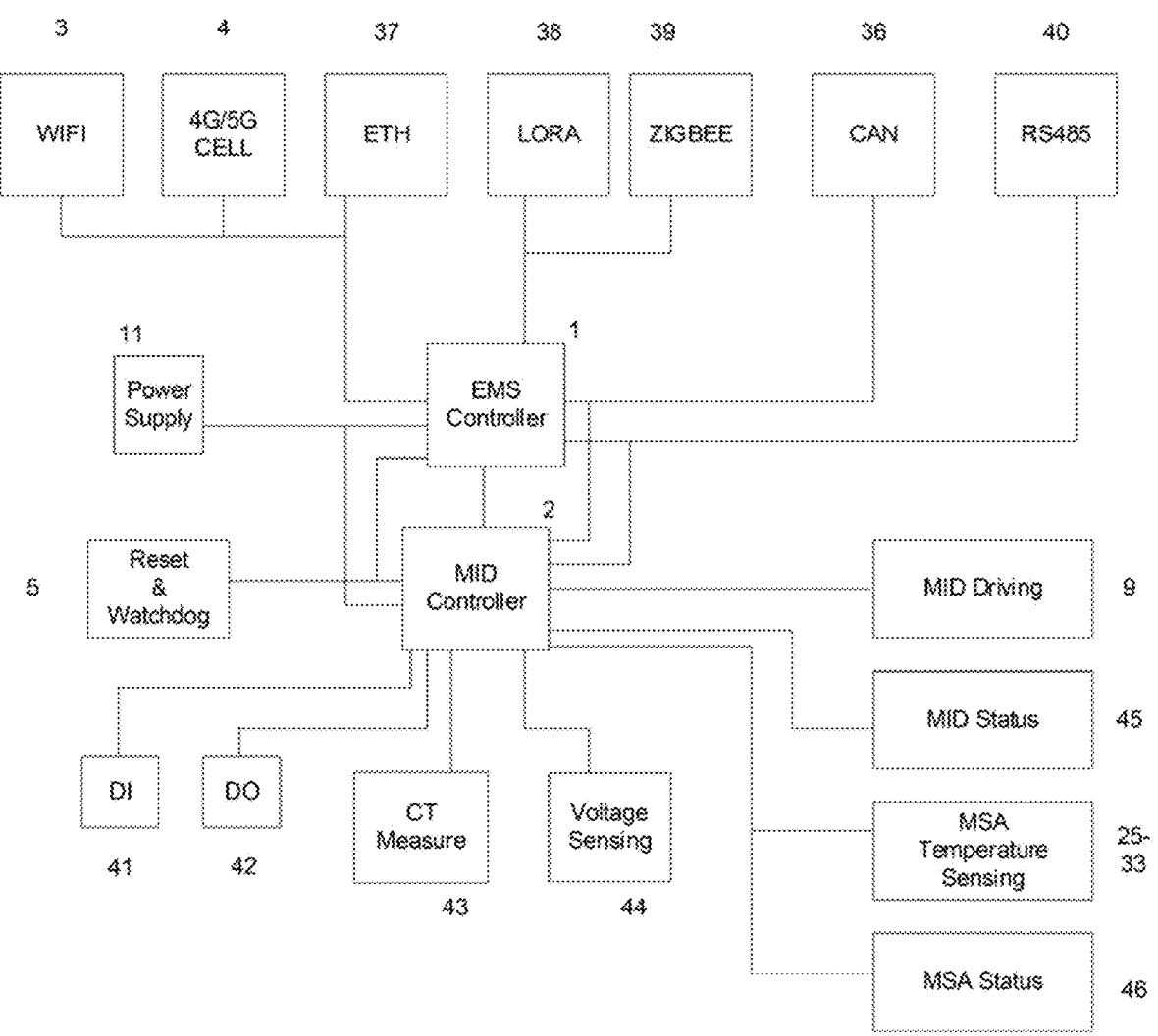
FIG. 21 illustrates a structural schematic diagram of an EMS device according to some embodiments of the present disclosure.

FIG. 21 illustrates a structural schematic diagram of an EMS device according to some embodiments of the present disclosure.

As shown in FIG. 21, the EMS device includes the MID controller 2, the EMS controller 1, a power supply circuit 11, a MID driving circuit 9, a MID status circuit 45, MSA temperature sensors 25-33, an MSA status circuit 46, a voltage sensor 44, a current transformer (CT) measurement circuit 43, a digital output circuit 42, a digital input circuit 41, a reset and watchdog circuit 5, a Wi-Fi interface circuit 3, a 4G/5G cellular network interface circuit 4, an Ethernet interface circuit 37, a long range (LoRa) wireless interface circuit 38, a Zigbee interface circuit 39, a control area network (CAN) interface circuit 36, and an RS485 interface circuit 40. The EMS device shown in FIG. 21 is intended to be exemplary. More or less components may be included according to actual needs.

The EMS controller 1 is an energy controller implementing sophisticated energy management strategies. The EMS controller 1 is connected to various communication interface circuits including the Wi-Fi interface circuit 3, the 4G/5G cellular network interface circuit 4, and the Ethernet interface circuit 37 to connect to Internet for remote monitoring and management. The EMS controller 1 is also connected to various wireless communication interface circuits including the LoRa wireless interface circuit 38 and the Zigbee interface circuit 39 to form a local wireless control network with DER devices (e.g., a photovoltaic inverter 58). The EMS controller 1 is also connected to the RS-485 interface circuit 40 to connect to the electricity meter, the DER devices, and a power generator controller to form a local wired control network. The EMS controller 1 is also connected to the CAN interface circuit 36 to connect to the MID controller 2 and BESS 50 for synchronized operation. The EMS controller 1 shown in FIG. 21 is intended to be exemplary. More or less components may be included according to actual needs.

In some embodiments, through the Wi-Fi interface circuit 3, the 4G/5G cellular network interface circuit 4, and the Ethernet interface circuit 37, the EMS controller 1 communicates with a remote server for managing a virtual power plant (VPP). VPP is a network of decentralized energy resources, i.e., power generating devices, such as wind farms, solar parks, combined heat and power (CHP) units, etc. In this case, the DER devices connected to the household microgrid can be part of VPP. The remote server monitors, forecast, optimizes and trades power of the DER devices. In this way, fluctuations in the generation of renewables can be balanced by ramping up and down power generation and power consumption of controllable devices. The remote server helps to integrate the DER devices in the household microgrid to participate power exchanges. The EMS controller 1 may receive instructions from the remote server to perform tasks of integrating the DER devices into VPP.

In some embodiments, the user of the household microgrid may manually control the DER devices and household loads through a smart phone application program. In this case, the EMS controller 1 may receive instructions from the application program to control the power generation of the DER devices and the power consumption of the household loads.

In some embodiments, through the LoRa wireless interface circuit 38 and the Zigbee interface circuit 39, the EMS controller communicates with the DER devices. LoRa and ZigBee are among the most popular low-power wireless Internet of Things (IoT) network technologies. Compared with the Wi-Fi technology, the LoRa and ZigBee technologies support much lower data rate, but consumes much less power. LoRa offers longer range than ZigBee. Both LoRa and ZigBee are widely available on the DER devices.

In some embodiments, through the RS-485 interface circuit 40, the EMS controller communicates with the DER devices. The RS-485 interface is wired serial communication technology widely used in industrial control systems, including the electricity meters and the DER devices.

In some embodiments, through the CAN interface circuit 36, the EMS controller communicates with the MID controller 2 and BESS 50. The CAN interface supports a controller area network. The CAN interface provides superior reliability in a noisy environment such as the household microgrid.

The MID controller 2 is configured to monitor the utility grid and the household microgrid through the voltage sensor 44 and the CT measurement circuit 43; control the MID driving circuit 9 to drive the MID switch to connect to or disconnect the household microgrid from the utility grid; detect the MID connection status through the MID status circuit 45; measure MSA internal temperature through the MSA temperature sensors 25-33; and detect presence of the electricity meter on MSA through the MSA status circuit 46. The MID controller 2 is connected to the digital input circuit 41 to detect a digital input signal, for example, an emergency shutdown signal. The MID controller 2 is connected to the digital output circuit 42 to turn on or off the power generator, or to connect or disconnect parts of the household loads. The MID controller 2 shown in FIG. 21 is intended to be exemplary. More or less components may be included according to actual needs.

The power supply circuit 11 is configured to supply DC powers to the electronic circuits in BESS 50, MSA 47, and EMS 49. For example, the power supply circuit 11 may obtain the power supply from BESS 50 and convert the power supply into various DC voltages required to power the electronic circuits in BESS 50, MSA 47, and EMS 49.

The reset and watchdog circuit 5 is configured to provide a system reset function. For example, the user may manually reset the EMS device through the reset and watchdog circuit 5. In another example, a watchdog kick program code in the software programs of the EMS controller 1 and/or the MID controller 2 may be prevented from kicking the reset and watchdog circuit 5 due to a software bug. In this case, the reset and watchdog circuit 5 may automatically reset the EMS controller 1 and/or the MID controller 2 to self-recover from malfunction caused by the software bug.

Figure 22:
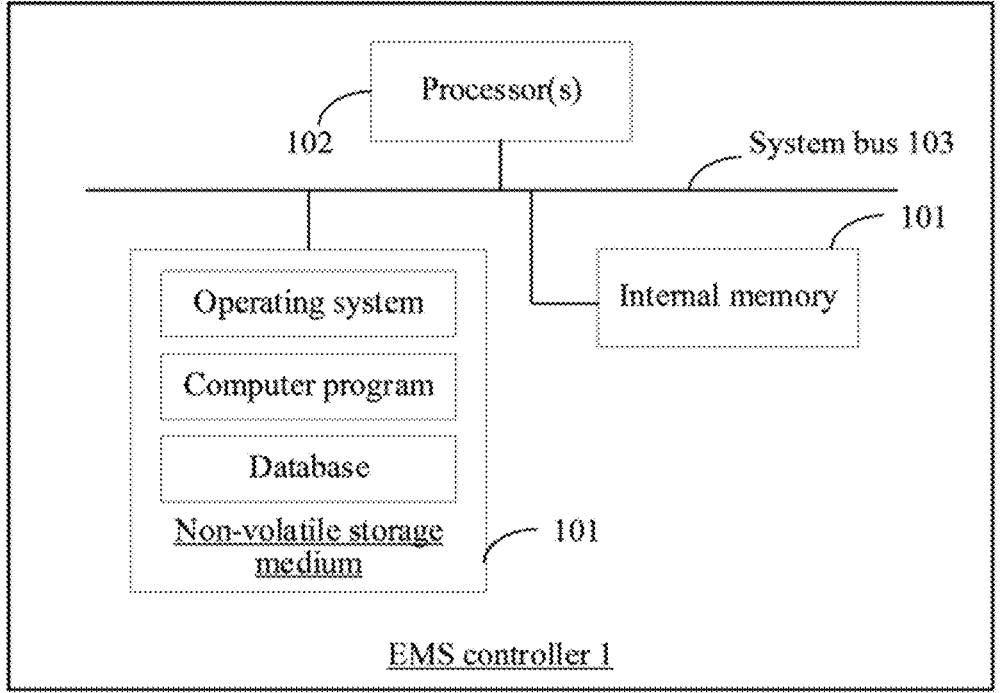
FIG. 22 illustrates a structural schematic diagram of an EMS controller according to some embodiments of the present disclosure.

FIG. 22 illustrates a structural schematic diagram of an EMS controller according to some embodiments of the present disclosure. As shown in FIG. 22, the EMS controller includes a memory 101 and a processor 102 connected by a system bus 103. The memory 101 includes a non-volatile storage medium and an internal memory. The non-volatile storage medium of the computer device stores an operating system, and may further store computer programs. The computer programs, when executed by the processor 102, may cause the processor 102 to implement various methods for controlling the components in the household microgrid.

In some embodiments, the EMS controller may further include output devices and input devices. The output device may be a display screen. The display screen may be a liquid crystal display screen or an e-ink display screen. The input devices may be one or more of a touch layer covering the display screen, a button, a trackball, a touchpad disposed on a housing of the EMS device, an external keyboard, a mouse, and the like.

A person skilled in the art may understand that the structure shown in FIG. 22 is only a block diagram of a partial structure related to the solution of the present disclosure and does not constitute a limitation on the EMS controller. The EMS controller may specifically include more or fewer components than those shown in FIG. 22, or some components may be combined, or different components may be used.

A person of ordinary skill in the art may understand that all or some of procedures of the method in the foregoing embodiments may be implemented by a computer program instructing relevant hardware. The program may be stored in a non-volatile computer-readable storage medium. When the program is executed, the procedures of the foregoing method embodiments may be implemented. References to the memory, the storage, the database, or other medium used in the embodiments provided in the present disclosure may all include a non-volatile or a volatile memory.

In some embodiments, the non-volatile memory may include a read-only memory (ROM), a programmable read-only memory (PROM), an electrically programmable read-only memory (EPROM), an electrically erasable programmable read-only memory (EEPROM) or a flash memory. The volatile memory may include a random-access memory (RAM) or an external high-speed cache. As an illustration and not a limitation, a RAM is available in many forms, such as a static random-access memory (SRAM), a dynamic random-access memory (DRAM), a synchronous dynamic random-access memory (SDRAM), a double data rate SDRAM (DDR SDRAM), an enhanced SDRAM (ES-DRAM), a synchLink DRAM (SLDRAM), a Rambus DRAM (RDRAM), and a direct Rambus DRAM (DRDRAM).

In some embodiments, the processor may be a plurality of processors, microprocessors, and microcontrollers. For example, the processor may include a central processing unit (CPU), a digital signal processor (DSP), a field programmable gate array (FPGA), or a combination thereof. The processor may be an Arm-based processor and/or a Power Architecture based processor.

In some embodiments, the MID controller may include a memory and processor structure similar to the EMS controller.

Various configurations of the household microgrid and associated energy management processes will be described in details below.

Figure 23:
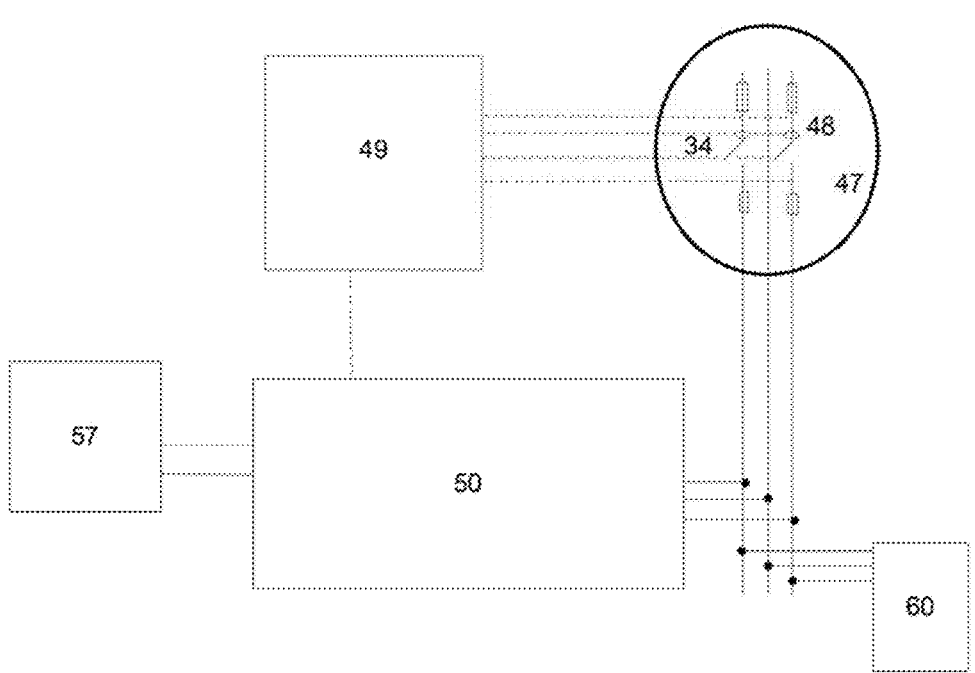
FIG. 23 illustrates a schematic diagram of a household microgrid being in an off-grid configuration according to some embodiments of the present disclosure.

FIG. 23 illustrates a schematic diagram of a household microgrid being in an off-grid configuration according to some embodiments of the present disclosure.

As shown in FIG. 23, EMS 49 is connected to MSA 47 through a wireline or wireless connection. EMS 49 obtains the utility grid information from the line-side voltage and current detection circuit of MSA 47. When a mains power outage occurs, EMS 49 controls the built-in MID 34 in MSA 47 to disconnect, isolate the abnormal utility grid, and notify BESS 50 to switch from a grid-connected operation mode to an isolated off-grid operation mode to provide backup power for the household microgrid. When the mains power is restored, EMS 49 controls the built-in MID 34 in MSA 47 to close, controls the BESS voltage and the utility grid voltage to have the same frequency, phase, and amplitude, connects to the utility grid after synchronization is achieved, and notifies BESS 50 to switch from the isolated off-grid operation mode to the grid-connected operation mode, such that the mains power can supply power to the household microgrid.

Figure 24:
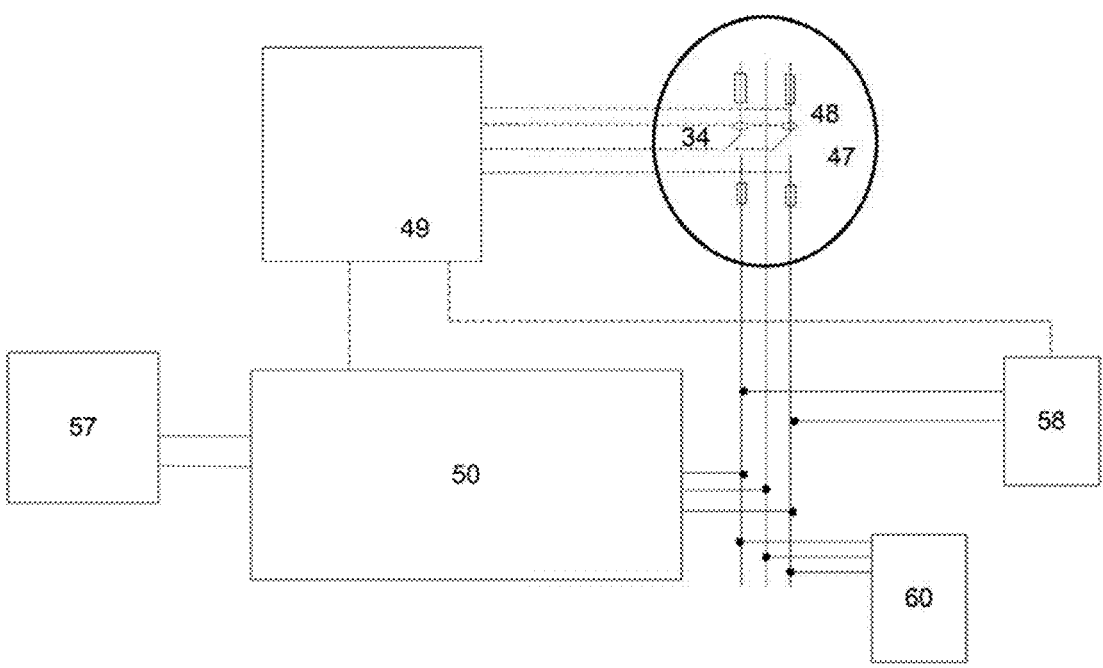
FIG. 24 illustrates a schematic diagram of a household microgrid being in a photovoltaic power generation configuration according to some embodiments of the present disclosure.

FIG. 24 illustrates a schematic diagram of a household microgrid being in a photovoltaic power generation configuration according to some embodiments of the present disclosure.

In an off-grid situation, the charging/discharging power of BESS 50, the output power of the PV inverter 58, and the load power in the household microgrid maintain a balanced relationship. The PV inverter 58 is AC coupled. If the power generated by the PV inverter 58 is greater than the chargeable power and load power of BESS 50, it may cause abnormal voltage in the household microgrid. Therefore, EMS 49 controls the power generation of the PV 57 and the PV inverter 58 connected to BESS 50 in the off-grid operation mode.

EMS 49 provides the following control methods. In a communication current limiting control method, BESS 50 and the AC-coupled PV inverter 58 maintains communication with EMS 49. When the solar power output generated by the PV inverter 58 is greater than the maximum charging power of BESS, EMS 49 notifies the PV inverter 58 to reduce or stop outputting power through communication.

Figures 25, 26:
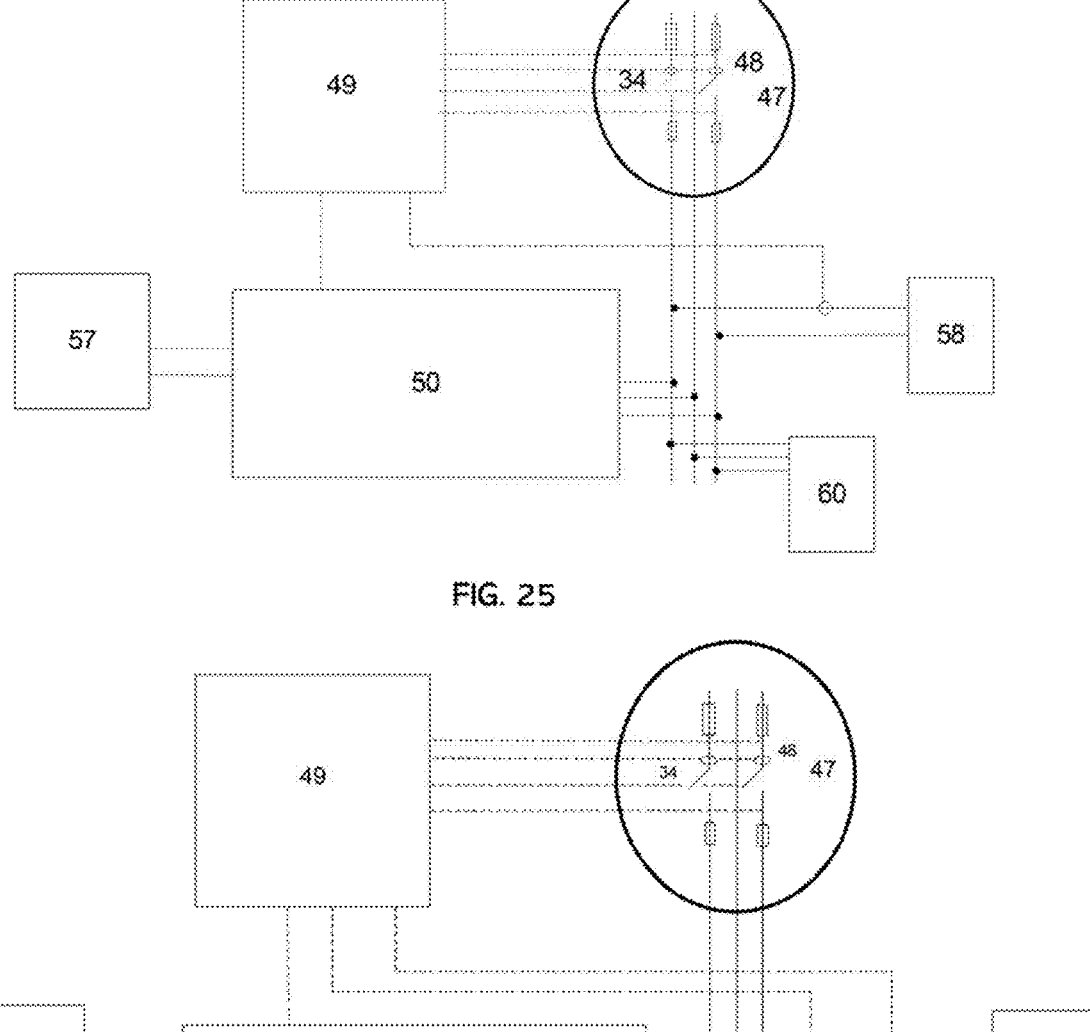
FIG. 25 illustrates a schematic diagram of a household microgrid being in another photovoltaic power generation configuration according to some embodiments of the present disclosure.
FIG. 26 illustrates a schematic diagram of a household microgrid being in another photovoltaic power generation configuration according to some embodiments of the present disclosure.

FIG. 25 illustrates a schematic diagram of a household microgrid being in another photovoltaic power generation configuration according to some embodiments of the present disclosure.

The amount of the output power of BESS 50 is communicated to EMS 49. The AC-coupled photovoltaic inverter 58 has no communication means with EMS 49. When the solar power output generated by the PV inverter 58 is greater than the maximum charging power of BESS 50, EMS 49 notifies BESS 50 to increase the output frequency through communication. The grid-connected photovoltaic inverter 58 often includes frequency power control and regulation. As the frequency of the household microgrid increases, the photovoltaic inverter 58 may reduce the power output. When the frequency is higher than a certain threshold (such as 61 Hz), the photovoltaic inverter 58 may stop the power output.

FIG. 26 illustrates a schematic diagram of a household microgrid being in another photovoltaic power generation configuration according to some embodiments of the present disclosure.

The amount of the output power of BESS 50 is communicated to EMS 49. The AC-coupled photovoltaic inverter 58 has no communication means with EMS 49, but a disconnection device 59 is connected in series before the output port of the photovoltaic inverter 58, and the disconnection device 59 is controlled by EMS 49. When the solar power output generated by the photovoltaic inverter 58 is greater than a maximum charging power of BESS 50, EMS 49 disconnects the output of the photovoltaic inverter 58. When the maximum charging power of BESS 50 is greater than the solar power output generated by the photovoltaic inverter 58, EMS 49 closes the disconnection device 59 again to connect the photovoltaic inverter 58 to the household microgrid.

Figure 27:
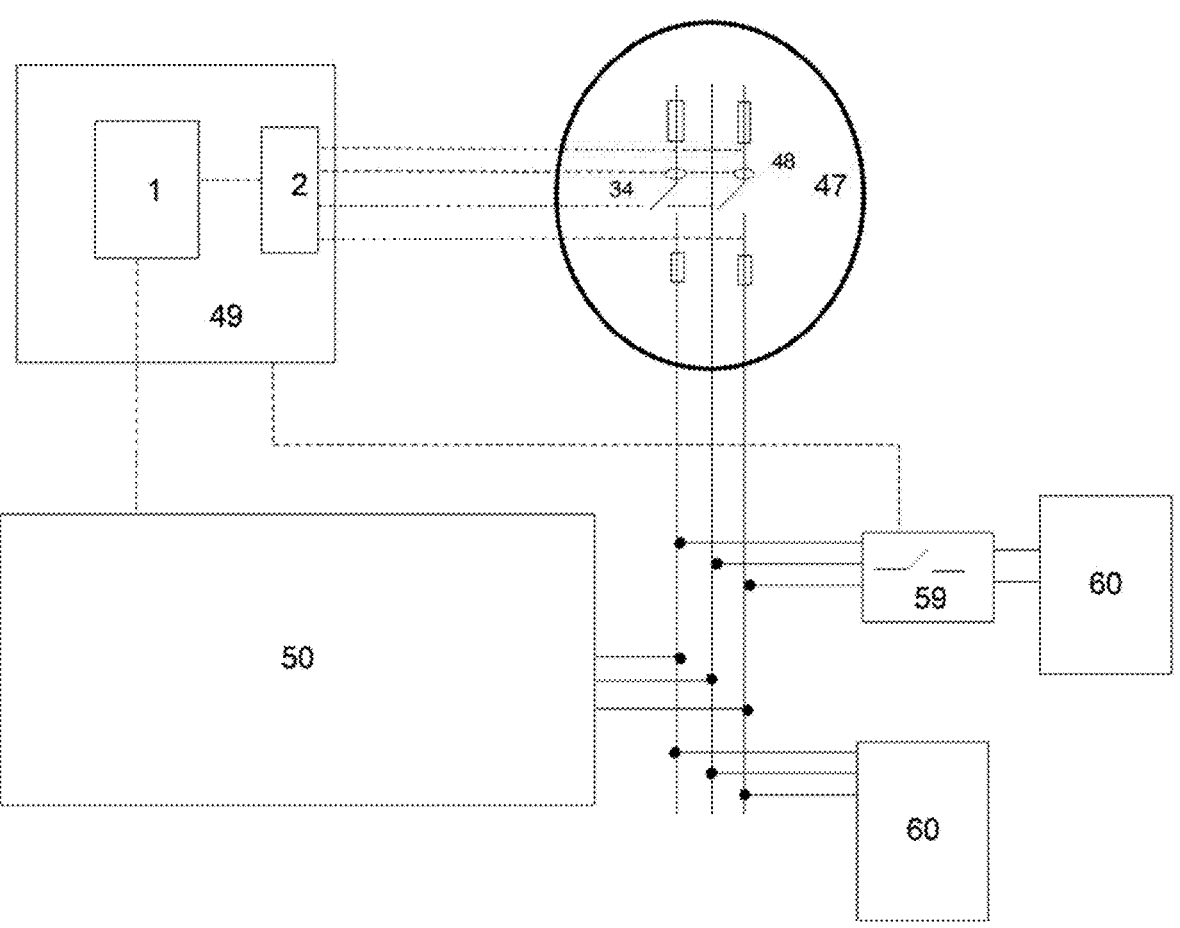
FIG. 27 illustrates a schematic diagram of a household microgrid being in a load capacity limited configuration according to some embodiments of the present disclosure.

FIG. 27 illustrates a schematic diagram of a household microgrid being in a load capacity limited configuration according to some embodiments of the present disclosure.

Generally, EMS 49, MSA 47, and BESS 50 may form a whole-house backup power system. However, when the output power of BESS 50 is not enough to support the whole-house loads and a power outage is about to occur, parts of the household loads may be cut off to achieve partial backup power. When the utility grid is out, EMS 49 disconnects the MID device 34 in MSA 47, starts the BESS 50 system backup power, and at the same time, controls the disconnection device 59 to disconnect the non-backup load from the household microgrid. The non-backup load is a part of the household loads that is cut off to achieve the partial backup power. In this case, the BESS 50 system backup power only supports essential parts of the household loads.

Figure 28:
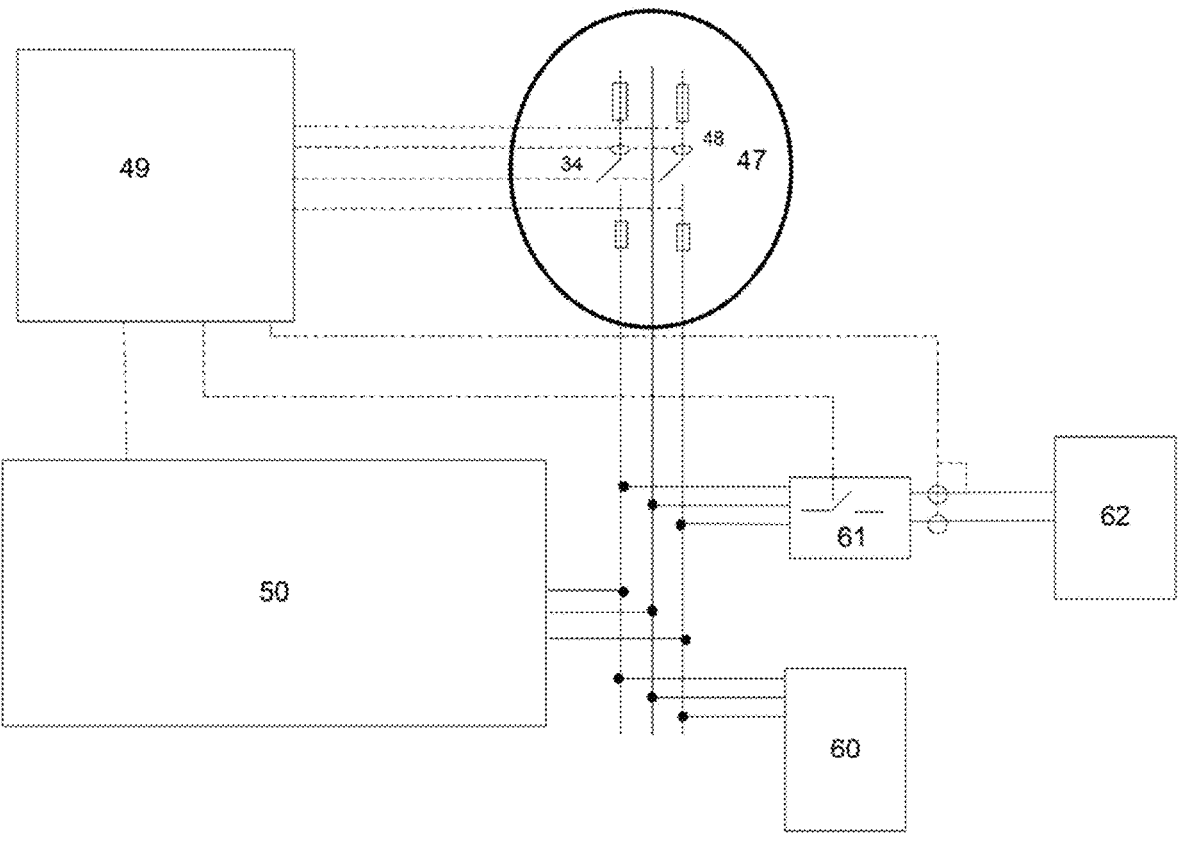
FIG. 28 illustrates a schematic diagram of a household microgrid being powered by BESS and/or a portable generator according to some embodiments of the present disclosure.

FIG. 28 illustrates a schematic diagram of a household microgrid being powered by BESS and/or a portable generator according to some embodiments of the present disclosure. The portable generator may be a diesel generator.

EMS 49 controls a portable generator 62 to provide the backup power to the household microgrid. When the utility grid is abnormal, EMS 4 controls MSA 1 to disconnect the utility grid. BESS 50 becomes the backup power for the household microgrid. At this time, the user may manually turn on the portable generator 62. After EMS 49 detects that a generator voltage is normal and notifies BESS 50 that the output voltage is synchronized with the portable generator 62 (same frequency, same phase, same amplitude), EMS 49 controls a generator access circuit 61 to connect the portable generator 62. The portable generator 62 supplies power to the household microgrid and charges BESS 50 (the charging power may be adjusted by the user through an APP).

When the utility grid is disconnected, if the user manually shuts down the portable generator 62, EMS 49 controls the generator access circuit 61 to disconnect. The portable generator 62 is disconnected from the household microgrid. BESS 50 discharges to provide the backup power for the household microgrid.

When the mains power of the utility grid is restored, after EMS 49 detects that the mains voltage is normal, EMS 49 controls the generator access circuit 61 to disconnect the portable generator 62. BESS 50 provides the backup power for the household microgrid, and controls the output voltage of BESS 50 to be synchronized with the mains power of the utility grid (same frequency, same phase, same amplitude). EMS 49 controls MSA 47 to connect to the utility grid. The user may shut down the portable generator 62.

Figures 29, 30:
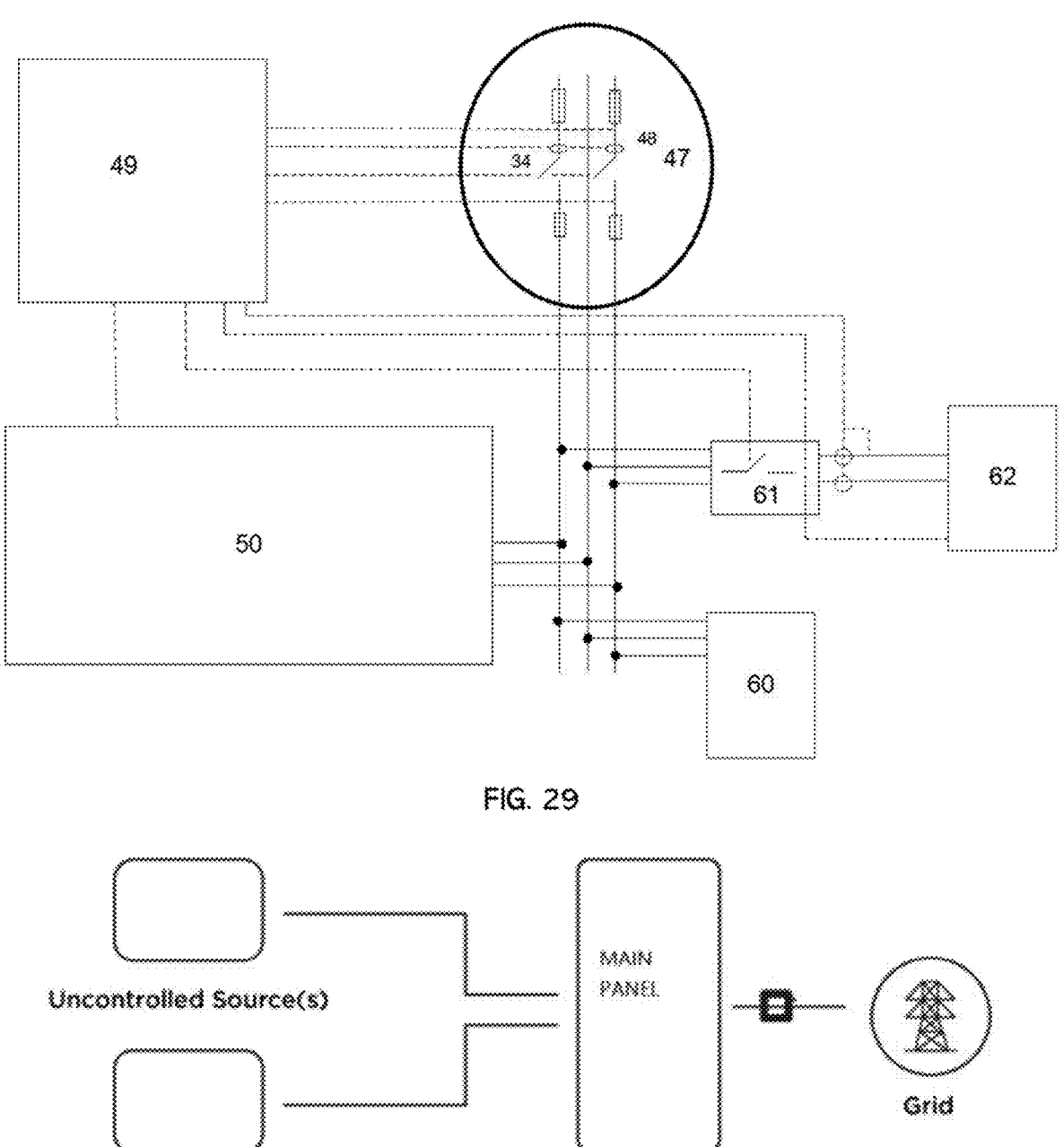
FIG. 29 illustrates a schematic diagram of a household microgrid being powered by BESS and/or a standby generator according to some embodiments of the present disclosure.
FIG. 30 illustrates a schematic diagram of power system control (PSC) according to some embodiments of the present disclosure.

FIG. 29 illustrates a schematic diagram of a household microgrid being powered by BESS and/or a standby generator according to some embodiments of the present disclosure. The standby generator 62 may be a portable generator, such as a diesel generator.

When the utility grid outage occurs, EMS 49 controls MSA 47 to disconnect the utility grid, and BESS 50 provides the backup power for the household microgrid. EMS 49 communicates to BESS 50 to obtain the battery capacity (i.e., state of charge or SOC) of BESS 50. When the battery capacity SOC is lower than a preset capacity threshold, EMS 49 starts the standby generator 62. When EMS 49 detects that the generator output voltage is normal and notifies BESS 50 that the output voltage is synchronized with the standby generator (same frequency, same phase, same amplitude), EMS 49 controls the generator access circuit 61 to connect the standby generator 62. The standby generator 62 is connected to the household microgrid to provide the backup power to the household microgrid. At the same time, the standby generator 62 may charge BESS 50. The charging power is automatically controlled by EMS 49 and may also be adjusted by the user through the APP.

If the standby generator 62 stops generating electricity, EMS 49 controls the generator access circuit 61 to disconnect the standby generator 62. The standby generator 62 is separated from the household microgrid. BESS 50 discharges to provide the backup power for the household microgrid.

When the mains power of the utility grid is restored, after EMS 49 detects that the mains voltage is normal, EMS 49 controls the generator access circuit 61 to disconnect the standby generator 62. BESS 50 provides the backup power for the household microgrid, and controls the output voltage of BESS 50 to be synchronized with the mains power (same frequency, same phase, same amplitude). EMS 49 controls MSA 47 to connect to the utility grid. EMS 49 automatically shuts down the standby generator 62.

FIG. 30 illustrates a schematic diagram of power system control (PSC) according to some embodiments of the present disclosure.

In the meter combo load center, the main panel has a capacity of 200 A and is equipped with a 200A main circuit breaker. According to the 120% rule (NEC 2020 705.12(B) (3)(2)), the main distribution can only be equipped with a maximum of a 40 A circuit breaker (200*1.2−200=40A). The maximum power of the power generation equipment that can be connected is about 7.6 Kw. In this way, the main panel busbar may not exceed 200 A over-current operation.

The household microgrid needs to be connected to BESS 50 with a rated power of 11.5 Kw (rated current of about 48 A), and a 60 A circuit breaker needs to be configured to connect to the main panel.

The NEC 705.13 PCS rule needs to be used to solve the BESS 50 connection problem without upgrading the main panel or replacing the main circuit breaker.

Figure 31:
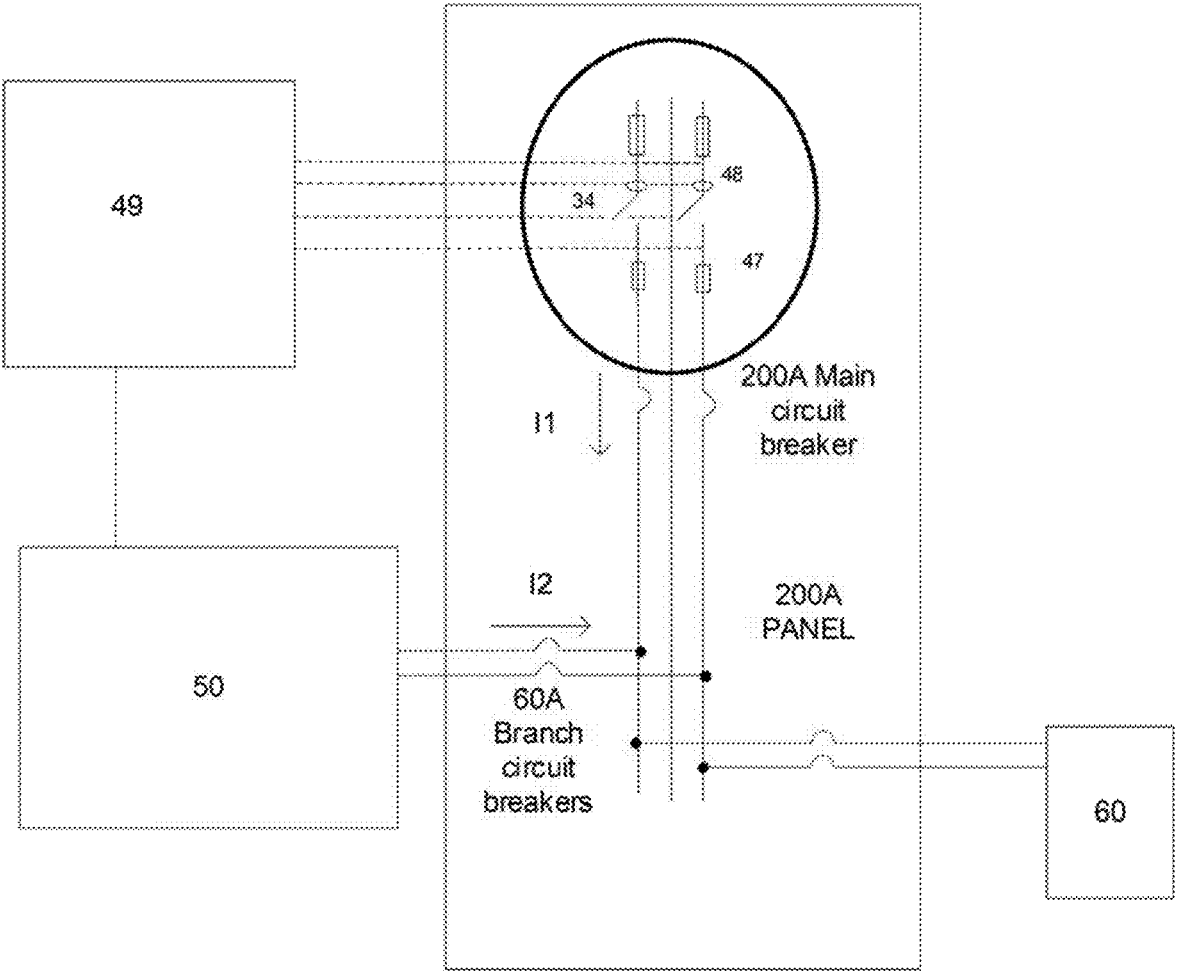
FIG. 31 illustrates a schematic diagram of over-current protection for a main panel through limiting BESS current according to some embodiments of the present disclosure.

FIG. 31 illustrates a schematic diagram of over-current protection for a main panel through limiting BESS current according to some embodiments of the present disclosure.

In the case of grid-connected operation, EMS 49 detects the grid input current I1 in MSA 1, and obtains the BESS 50 output current I2 by communicating with BESS 50. When (I1+I2)>200 A (for example, I1=159 A, I2=45 A), EMS 49 sends a current limit instruction to BESS 50 to limit the BESS 50 output current to below 32A under I2 ((159+32) =191 A<200 A). EMS energy scheduling function may include multiple energy strategies.

Figure 32:
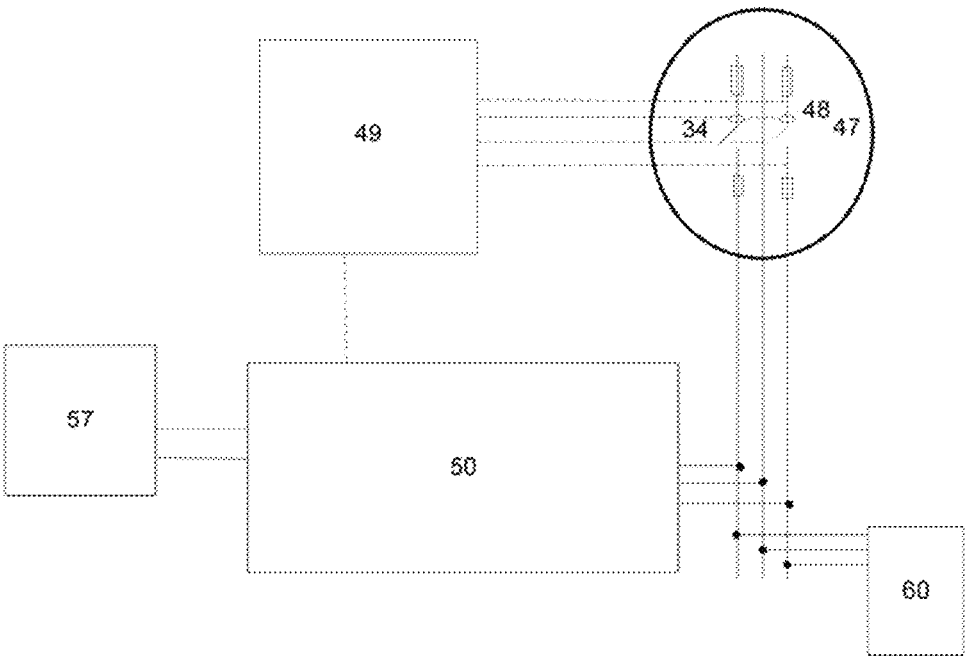
FIG. 32 illustrates a schematic diagram of a household microgrid being powered by BESS and/or a photovoltaic power generator according to some embodiments of the present disclosure.

FIG. 32 illustrates a schematic diagram of a household microgrid being powered by BESS and/or a photovoltaic power generator according to some embodiments of the present disclosure.

As shown in FIG. 32, EMS 49 provides a self-generation and self-consumption scheduling function. The household microgrid is disconnected from the utility grid. The household load 60 is powered by BESS 50, which receives power from the photovoltaic strings 57.

Figure 33:
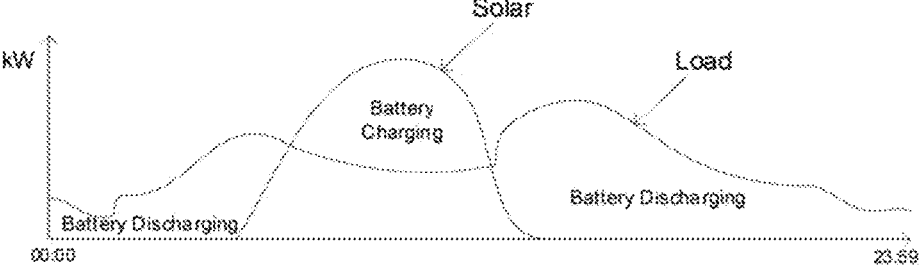
FIG. 33 illustrates a schematic diagram of battery charging and discharging profile according to some embodiments of the present disclosure.
Figure 34:
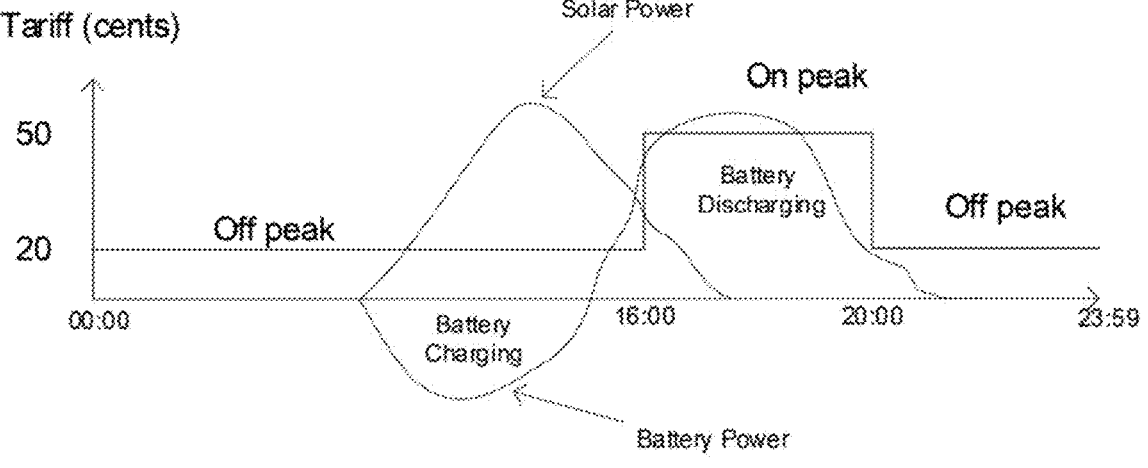
FIG. 34 illustrates a schematic diagram of battery charging and discharging profile considering time-of-use according to some embodiments of the present disclosure.

FIG. 33 illustrates a schematic diagram of battery charging and discharging profile according to some embodiments of the present disclosure. FIG. 34 illustrates a schematic diagram of battery charging and discharging profile considering time-of-use according to some embodiments of the present disclosure As shown in FIG. 33, the horizontal axis shows 24 hours in a day, and the vertical axis shows the charging and the discharging wattages. In this case, EMS 49 provides the self-generation and self-consumption scheduling function. When performing the self-generation and self-consumption scheduling function, EMS 49 controls BESS 50 to discharge its battery when sunlight is absent and controls BESS 50 to charge its battery when sunlight is present. For example, the solar power charges the battery of BESS 50 during day time, and the battery of BESS 50 discharges to power the household loads during night time.

As shown in FIG. 34, the horizontal axis shows 24 hours in a day, and the vertical axis shows the tariff of the utility grid in cents. In this case, EMS 49 provides the self-generation and self-consumption scheduling function. When performing the self-generation and self-consumption scheduling function, EMS 49 controls BESS 50 to discharge its battery when sunlight is weak and utility tariff is at its peak and controls BESS 50 to charge its battery when sunlight is strong and utility tariff is off its peak.

In the embodiments of the present disclosure, the EMS controller performs the energy management in response to the utility grid failure, and optimizes the BESS charging and discharging strategy for various configurations of the household microgrid.

The above description of the disclosed embodiments enables those skilled in the art to implement or use the present disclosure. Various modifications to these embodiments will be readily apparent to those skilled in the art, and the generic principles defined herein may be practiced in other embodiments without departing from the spirit or scope of the present disclosure. Therefore, the present disclosure is not to be limited to the embodiments shown herein but is to be accorded the broadest scope consistent with the principles and novel features disclosed herein.

What is claimed is:

1. An energy management system (EMS) device for managing a meter socket adapter (MSA), the MSA comprising a housing matching an electricity meter and a meter socket; a plurality of power conductors that connect among the electricity meter, the meter socket, and a battery energy storage system (BESS); a meter interconnection device (MID) switch for connecting a utility grid or one or more distribution energy resource (DER) devices to supply power to household loads in the household microgrid; a MID driving circuit for driving the MID switch to close or open; and a meter detection circuit for detecting insertion and removal of the electricity meter, the EMS device comprising:
an EMS controller configured to:
control the MID switch disposed inside the MSA to respond to occurrence and restoration of an outage of the utility grid; and
control the one or more DER devices to supply power to the household loads in the MSA connected the household microgrid to optimize household energy consumption and generation; and
an MID controller configured to:
monitor a state of the utility grid and a state of the household microgrid;

based on the state of the utility grid and the state of the household microgrid, control the MID switch to make suitable electrical connections among the utility grid, the one or more DER devices, and the household loads in the household microgrid,
wherein:
the one or more DERs include the BESS and the photovoltaic power generator;
the EMS controller communicates with the BESS but does not communicate with the photovoltaic power generator;
in response to output power of the photovoltaic power generator being greater than a maximum charging power of charging batteries of the BESS, the EMS controller is further configured to notify the BESS to increase its output frequency; and
in response to detecting an increase of the output frequency of the BESS, the photovoltaic power generator reduces its output power.

2. An energy management system (EMS) device for managing a meter socket adapter (MSA), the MSA comprising a housing matching an electricity meter and a meter socket; a plurality of power conductors that connect among the electricity meter, the meter socket, and a battery energy storage system (BESS); a meter interconnection device (MID) switch for connecting a utility grid or one or more distribution energy resource (DER) devices to supply power to household loads in the household microgrid; a MID driving circuit for driving the MID switch to close or open; and a meter detection circuit for detecting insertion and removal of the electricity meter, the EMS device comprising:
an EMS controller configured to:
control the MID switch disposed inside the MSA to respond to occurrence and restoration of an outage of the utility grid; and
control the one or more DER devices to supply power to the household loads in the MSA connected the household microgrid to optimize household energy consumption and generation; and
an MID controller configured to:
monitor a state of the utility grid and a state of the household microgrid;
based on the state of the utility grid and the state of the household microgrid, control the MID switch to make suitable electrical connections among the utility grid, the one or more DER devices, and the household loads in the household microgrid,
wherein:
the one or more DERs include the BESS and the photovoltaic power generator;
the EMS controller communicates with the BESS but does not communicate with the photovoltaic power generator;
a disconnection device is arranged at an output of the photovoltaic power generator and is controlled by the EMS controller;
in response to output power of the photovoltaic power generator being greater than a maximum charging power of charging batteries of the BESS, the EMS controller is further configured to control the disconnection device to disconnect the photovoltaic power generator; and
in response to the output power of the photovoltaic power generator being smaller than the maximum charging power of charging batteries of the BESS, the EMS controller is further configured to control the disconnection device to re-connect the photovoltaic power generator.

3. The energy management system (EMS) device according to claim 2, wherein the MSA further comprises:

a contact switch disposed on a side of the MSA facing toward the electricity meter and being able to be physically in contact with the electricity meter, wherein a closed state is provided by the contact switch when the electricity meter is inserted in the MSA, and an open state is provided by the contact switch when the electricity meter is removed from the MSA; wherein the meter detection circuit is configured to:

in response to a detection that the contact switch changes from the closed state to the open state, determine that the electricity meter is inserted into the MSA, and energize conductors exposed on the side of the MSA facing toward the electricity meter for receiving the electricity meter; and in response to a detection that the contact switch changes from the open state to the closed state, determine that the electricity meter is removed from the MSA, and de-energize the conductors exposed on the side of the MSA facing toward the electricity meter.

4. The MSA according to claim 2, further comprising:

a manual switch to allow a user to manually control the MID switch to shut down all power to the household microgrid in case of emergency.

5. The MSA according to claim 2, further comprising:

a metering circuit to measure electricity supply from the utility grid to determine whether an outage of the utility grid occurs or not, wherein:

in response to the electricity supply changing from a normal range to an abnormal range, the MID switch is controlled to disconnect between the household microgrid and the utility grid, and to connect the one or more DER devices to supply power to the household loads in the household microgrid; and in response to the electricity supply changing from the abnormal range to the normal range, the MID switch is controlled to connect between the household microgrid and the utility grid to supply power to the household loads in the household microgrid, and to disconnect the one or more DER devices from the household loads.

6. The MSA according to claim 2, further comprising:

an internal insulation wall to provide insulation between an input from the utility grid and an output to the household microgrid; and receiving conductors to receive the electricity meter and insertion conductors to plug into the meter socket.

7. The MSA according to claim 2, further comprising:

a female connector on a side of the housing to receive a male connector of a connection cable being connected to the one or more DER devices; and a connectorized jumper configured to be inserted into the female connector to maintain normal operation of the meter combo load center without connecting to the one or more DER devices after the connection cable is unplugged from the MSA.

8. The MSA according to claim 2, further comprising:

an opening on a side of the housing to receive connection jaws of a connection cable being connected to the one or more DER devices; and a jaw jumper configured to be inserted into the opening to maintain normal operation of the meter combo load center without connecting to the one or more DER devices after the connection cable is unplugged from the MSA.

9. The EMS device according to claim 2, wherein the EMS controller is further configured to:

communicate with Internet cloud to facilitate remote monitoring and management of the household microgrid and devices connected to the household microgrid through one or more of a Wi-Fi interface circuit, a cellular network interface circuit, and an Ethernet interface circuit; and communicate with the one or more DER devices, one or more measurement devices, and one or more other controllers through one or more of a LoRa interface, a ZigBee interface, an RS-485 interface, and a controller area network (CAN) interface.

10. The EMS device according to claim 2, wherein the MID controller is further configured to:

monitor the state of the utility grid and the state of the household microgrid through a current transformer (CT) measurement circuit and a voltage sensor, respectively;

based on the state of the utility grid and the state of the household microgrid, make the suitable electrical connections among the utility grid, the one or more DER devices, and the household loads in the household microgrid through a MID driving circuit; and detect insertion and removal of the electricity meter through a meter detection circuit.

11. The EMS device according to claim 2, wherein:

the EMS controller communicates with the MSA through a wired or wireless connection; and when controlling the MID switch to respond to the occurrence and restoration of the outage of the utility grid, the EMS controller is further configured to:

periodically retrieve a measurement of a utility grid input from a CT measurement circuit and a voltage sensor in the MSA;

in response to the measurement changing from a normal range to an abnormal range, control the MID switch to disconnect the household microgrid from the utility grid, and re-configure the household microgrid to supply power to the household loads from the one or more DER devices; and in response to the measurement changing from the abnormal range to the normal range, control the MID switch to re-connect the household microgrid to the utility grid after voltages, frequencies, and phases of a utility grid input and an output of the DER device supplying power to the household loads during the outage of the utility grid are synchronized, and re-configure the household microgrid to supply power to the household loads from the utility grid.

12. An energy management system (EMS) device for managing a meter socket adapter (MSA), the MSA comprising a housing matching an electricity meter and a meter socket; a plurality of power conductors that connect among the electricity meter, the meter socket, and a battery energy storage system (BESS); a meter interconnection device (MID) switch for connecting a utility grid or one or more distribution energy resource (DER) devices to supply power to household loads in the household microgrid; a MID driving circuit for driving the MID switch to close or open; and a meter detection circuit for detecting insertion and removal of the electricity meter, the EMS device comprising:

an EMS controller configured to:

control the MID switch disposed inside the MSA to respond to occurrence and restoration of an outage of the utility grid; and control the one or more DER devices to supply power to the household loads in the MSA connected the household microgrid to optimize household energy consumption and generation; and an MID controller configured to:

monitor a state of the utility grid and a state of the household microgrid;

based on the state of the utility grid and the state of the household microgrid, control the MID switch to make suitable electrical connections among the utility grid, the one or more DER devices, and the household loads in the household microgrid, wherein:

the one or more DERs include the BESS and the standby generator;

the EMS controller communicates with the BESS and the standby generator;

a generator access circuit is arranged at an output of the standby generator;

in response to the occurrence of the outage of the utility grid, the EMS controller is further configured to control the MID switch to disconnect between the utility grid and the household microgrid, notify the BESS to supply power to the household loads, and retrieve a state of charge (SOC) of batteries of the BESS;

in response to the SOC being smaller than a predetermined capacity threshold, the EMS controller is further configured to turn on the standby generator, detect that an output of the standby generator is normal, notify the BESS to synchronize its output with the output of the standby generator, and control the generator access circuit to connect the standby generator, the standby generator supplying power to the household loads and at the same time charging the batteries of the BESS;

in response to the standby generator stopping generating power, the EMS controller is further configured to control the generator access circuit to disconnect the standby generator, and notify the BESS to supply power to the household loads; and in response to the restoration of the outage of the utility grid, the EMS controller is further configured to control the generator access circuit to disconnect the standby generator, notify the BESS to supply power to the household loads and synchronize its output with the output of the utility grid, control the MID switch to re-connect between the utility grid and the household microgrid after the BESS output and the utility grid output are synchronized, and turn off the standby generator.

13. A household microgrid, comprising:

the EMS device according to claim 2, and a meter combo load center for connection between the household microgrid and the utility grid, the meter combo load center at least including the electricity meter and the meter socket.

14. A household microgrid, comprising:

the EMS device according to claim 1, and a meter combo load center for connection between the household microgrid and the utility grid, the meter combo load center at least including the electricity meter and the meter socket.

15. A household microgrid, comprising:

the EMS device according to claim 12, and a meter combo load center for connection between the household microgrid and the utility grid, the meter combo load center at least including the electricity meter and the meter socket.

\*   \*   \*   \*   \*